(12) United States Patent
Cheng et al.

(10) Patent No.: US 11,737,318 B2
(45) Date of Patent: Aug. 22, 2023

(54) DISPLAY PANEL AND MANUFACTURING METHOD THEREOF, ALIGNMENT METHOD

(71) Applicants: Chengdu BOE Optoelectronics Technology Co., Ltd., Chengdu (CN); BOE TECHNOLOGY GROUP CO., LTD., Beijing (CN)

(72) Inventors: Bo Cheng, Beijing (CN); Xiangdan Dong, Beijing (CN); Jun Yan, Beijing (CN); Fan He, Beijing (CN); Qi Liu, Beijing (CN); Hongwei Ma, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 519 days.

(21) Appl. No.: 17/041,080

(22) PCT Filed: Dec. 20, 2019

(86) PCT No.: PCT/CN2019/127177
§ 371 (c)(1),
(2) Date: Sep. 24, 2020

(87) PCT Pub. No.: WO2021/120216
PCT Pub. Date: Jun. 24, 2021

(65) Prior Publication Data
US 2022/0384541 A1    Dec. 1, 2022

(51) Int. Cl.
*H10K 59/122*    (2023.01)
*H10K 50/844*    (2023.01)
(Continued)

(52) U.S. Cl.
CPC ......... *H10K 59/122* (2023.02); *H10K 50/844* (2023.02); *H10K 71/00* (2023.02); *H10K 77/111* (2023.02); *H10K 59/1201* (2023.02)

(58) Field of Classification Search
None
See application file for complete search history.

(56) References Cited

U.S. PATENT DOCUMENTS

| 10,629,658 B1 | 4/2020 | Zhang et al. |
| 2016/0284775 A1 | 9/2016 | Lee et al. |

(Continued)

FOREIGN PATENT DOCUMENTS

| CN | 103839967 A | 6/2014 |
| CN | 105116580 A | 12/2015 |

(Continued)

OTHER PUBLICATIONS

International Search Report of PCT/CN2019/127177 in Chinese, dated Sep. 23, 2020.

(Continued)

*Primary Examiner* — J. E. Schoenholtz
(74) *Attorney, Agent, or Firm* — Collard & Roe, P.C.

(57) ABSTRACT

A display panel and a manufacturing method thereof, and an alignment method are provided. The display panel includes a display substrate and a cover plate connected through an optical adhesive layer. The display substrate includes a plurality of light emitting elements, a pixel defining layer, and an encapsulation layer; the encapsulation layer includes a first inorganic encapsulation layer, a first organic encapsulation layer, and a second inorganic encapsulation layer; the display panel includes a display region and a frame region including a cutting region and a dam glue region where a dam glue is located; at least one of the plurality of cover plate alignment marks is between the dam glue and the (Continued)

display region and is overlapped with the second inorganic encapsulation layer, and at least one of the plurality of cover plate alignment marks is between the dam glue and the cutting region.

20 Claims, 9 Drawing Sheets

(51) Int. Cl.
*H10K 71/00* (2023.01)
*H10K 77/10* (2023.01)
*H10K 59/12* (2023.01)

(56) References Cited

U.S. PATENT DOCUMENTS

| | | | |
|---|---|---|---|
| 2017/0194397 A1 | 7/2017 | Kim | |
| 2018/0157110 A1* | 6/2018 | Park | G02F 1/13338 |
| 2019/0229175 A1 | 7/2019 | Lhee et al. | |
| 2020/0152914 A1* | 5/2020 | Kim | H10K 50/8445 |
| 2020/0295299 A1* | 9/2020 | Yin | H10K 50/844 |
| 2021/0013440 A1* | 1/2021 | Kim | H10K 50/157 |

FOREIGN PATENT DOCUMENTS

| | | |
|---|---|---|
| CN | 109560113 A | 4/2019 |
| CN | 109830521 A | 5/2019 |
| CN | 110085629 A | 8/2019 |
| CN | 110085632 A | 8/2019 |
| KR | 10-2019-0057829 A | 5/2019 |

OTHER PUBLICATIONS

Notice of Transmittal of the International Search Report of PCT/CN2019/127177 in Chinese, dated Sep. 23, 2020.

Written Opinion of the International Searching Authority of PCT/CN2019/127177 in Chinese, dated Sep. 23, 2020.

* cited by examiner

DISPLAY PANEL AND MANUFACTURING METHOD THEREOF, ALIGNMENT METHOD

CROSS REFERENCE TO RELATED APPLICATIONS

This application is the National Stage of PCT/CN2019/127177 filed on Dec. 20, 2019, the disclosure of which is incorporated by reference.

TECHNICAL FIELD

Embodiments of the present disclosure relates to a display panel and a manufacturing method thereof, and an alignment method.

BACKGROUND

Organic light emitting diode (OLED) display devices are new display devices, which have many advantages, such as active light emission, high contrast, fast response speed, lightness, and flexibility.

Touch screens are more and more widely used in various portable devices because of advantages such as robustness, fast response, space saving, and convenient communication. It is foreseeable that a touch-sensitive OLED display device obtained by integrating a touch screen and an OLED display device will become the mainstream of the market.

SUMMARY

Embodiments of the present disclosure provide a display panel, which comprises a display substrate, an optical adhesive layer, and a cover plate. The display substrate comprises a flexible base substrate and comprises a plurality of light emitting elements, a pixel defining layer, and an encapsulation layer, in which the plurality of light emitting elements, the pixel defining layer, and the encapsulation layer are on the base substrate, the pixel defining layer separates the plurality of light emitting elements, and the encapsulation layer is on a side of the plurality of light emitting elements away from the base substrate; the optical adhesive layer is on a side of the encapsulation layer away from the base substrate; and the cover plate is on a side of the optical adhesive layer away from the display substrate and connected with the display substrate through the optical adhesive layer. The display panel comprises a display region and a frame region at a periphery of the display region; the frame region comprises a dam glue region where an annular dam glue is located and an annular cutting region which is on a side of the dam glue away from the display region; the encapsulation layer comprises a first inorganic encapsulation layer, a first organic encapsulation layer, and a second inorganic encapsulation layer which are sequentially arranged in a direction away from the base substrate; the display substrate further comprises a plurality of cover plate alignment marks configured for aligning the display substrate with the cover plate; and at least one of the plurality of cover plate alignment marks is overlapped with the second inorganic encapsulation layer in a direction perpendicular to the base substrate, and an orthographic projection of the at least one of the plurality of cover plate alignment marks on the base substrate is between an orthographic projection of dam glue on the base substrate and the display region, and/or an orthographic projection of at least one of the plurality of cover plate alignment marks on the base substrate is between the orthographic projection of the dam glue on the base substrate and the cutting region.

For example, the at least one of the plurality of cover plate alignment marks, of which the orthographic projection on the base substrate is between the orthographic projection of the dam glue on the base substrate and the cutting region, is not overlapped with the second inorganic encapsulation layer in the direction perpendicular to the base substrate.

For example, the at least one of the plurality of cover plate alignment marks, of which the orthographic projection on the base substrate is between the orthographic projection of the dam glue on the base substrate and the cutting region, is at least partially overlapped with the second inorganic encapsulation layer in the direction perpendicular to the base substrate.

For example, the display substrate comprises a touch structure, the touch structure is between the encapsulation layer and the optical adhesive layer in the direction perpendicular to the base substrate, and the touch structure comprises at least one metal layer, and the at least one metal layer comprises the plurality of cover plate alignment marks.

For example, a maximum size of an orthographic projection of each of the plurality of cover plate alignment marks on the base substrate ranges from 150 microns to 600 microns.

For example, an orthographic projection of each of the plurality of cover plate alignment marks on the base substrate comprises at least one shape selected from a group consisting of a T shape, a cross shape, and an L shape.

For example, a surface of the display substrate directly bearing the plurality of cover plate alignment marks is a flat surface.

For example, the frame region comprises a first frame region and a second frame region which are opposite to each other in a first direction; the display panel further comprises a flexible circuit board, and the flexible circuit board is connected with the second frame region; and the first frame region is provided with the at least one of the plurality of cover plate alignment marks located between the dam glue and the display region and overlapping with the second inorganic encapsulation layer in the direction perpendicular to the base substrate, and/or the second frame region is provided with the at least one of the plurality of cover plate alignment marks located between the dam glue and the cutting region.

For example, the frame region further comprises a third frame region and a fourth frame region which are opposite to each other in a second direction different from the first direction, and the display panel comprises a curved portion in at least one of the third frame region and the fourth frame region, and a portion of the cover plate corresponding to the curved portion is curved; the display panel further comprises a gate electrode driver in at least one of the third frame region and the fourth frame region; and the plurality of cover plate alignment marks are located outside the third frame region and the fourth frame region.

For example, the plurality of cover plate alignment marks comprise four cover plate alignment marks, the four cover plate alignment marks are respectively numbered as a first cover plate alignment mark, a second cover plate alignment mark, a third cover plate alignment mark, and a fourth cover plate alignment mark in an anticlockwise direction; with respect to an axis parallel to the first direction, a combination of the first cover plate alignment mark and the second cover plate alignment mark is symmetrical with a combination of the third cover plate alignment mark and the fourth cover plate alignment mark.

For example, the display substrate further comprises an electrode layer extending portion electrically connected with the plurality of light emitting elements, and the electrode layer extending portion is in the frame region; in the direction perpendicular to the base substrate, the electrode layer extending portion is between the plurality of cover plate alignment marks and the base substrate; and an orthographic projection of the electrode layer extending portion on the base substrate is overlapped with orthographic projections of the plurality of cover plate alignment marks on the base substrate.

For example, the electrode layer extending portion comprises a first conductive layer and a second conductive layer which are stacked, the second conductive layer is on a side of the first conductive layer away from the base substrate, and the second conductive layer comprises a portion recessed toward the base substrate, the portion is electrically connected with the first conductive layer, and the plurality of cover plate alignment marks are in a recessed region defined by the portion.

For example, the second conductive layer comprises a first sub-conductive layer, a second sub-conductive layer, and a third sub-conductive layer which are sequentially arranged on the base substrate and connected in parallel; and the first sub-conductive layer is between the second sub-conductive layer and the base substrate in the direction perpendicular to the base substrate.

For example, the display panel further comprises at least one switching element, each of the at least one switching element comprises a gate electrode, a source electrode, and a drain electrode; each of the plurality of light emitting elements comprises a first electrode layer and a second electrode layer, the first sub-conductive layer is in a same layer and made of a same material as the source electrode and drain electrode, the second sub-conductive layer is in a same layer and made of a same material as the first electrode layer, and the third sub-conductive layer is in a same layer and made of a same material as the second electrode layer.

For example, the second frame region is provided with a circuit board alignment mark configured for bending the flexible circuit board, and an orthographic projection of the circuit board alignment mark on the base substrate is spaced apart from the orthographic projections of the plurality of cover plate alignment marks on the base substrate; and the orthographic projection of the circuit board alignment mark on the base substrate has a maximum size, an orthographic projection of each of the plurality of cover plate alignment marks on the base substrate has a maximum size, and the maximum size of the circuit board alignment mark is smaller than the maximum size of each of the plurality of cover plate alignment marks.

For example, the cover plate comprises a window region in the display region and a light shielding portion located outside the display region; the orthographic projections of the plurality of cover plate alignment marks on the base substrate are in a region where an orthographic projection of the light shielding portion on the base substrate is located.

For example, each of the plurality of cover plate alignment marks has an integrated structure.

For example, a material of the plurality of cover plate alignment marks comprises a metal.

For example, the plurality of cover plate alignment marks are opaque.

Embodiments of the present disclosure further provide a manufacturing method of a display panel, which comprises: forming a pixel defining layer on a flexible base substrate; forming a plurality of light emitting elements on the base substrate, in which the pixel defining layer separates the plurality of light emitting elements; forming an encapsulation layer on the base substrate, in which the encapsulation layer is on a side of the plurality of light emitting elements away from the base substrate, and the encapsulation layer comprises a first inorganic encapsulation layer, a first organic encapsulation layer, and a second inorganic encapsulation layer which are sequentially arranged in a direction away from the base substrate; forming a plurality of cover plate alignment marks on the base substrate, in which the cover plate alignment marks are configured for aligning a display substrate comprising the pixel defining layer, the plurality of light emitting elements, the encapsulation layer, and the plurality of cover plate alignment marks with a cover plate; the display panel comprises a display region and a frame region at a periphery of the display region; the frame region comprises a dam glue region where an annular dam glue is located and an annular cutting region on a side of the dam glue away from the display region; at least one of the plurality of cover plate alignment marks is overlapped with the second inorganic encapsulation layer in a direction perpendicular to the base substrate, and an orthographic projection of the at least one of the plurality of cover plate alignment marks on the base substrate is between an orthographic projection of the dam glue on the base substrate and the display region, and/or an orthographic projection of at least one of the plurality of cover plate alignment marks on the base substrate is between the orthographic projection of the dam glue and the cutting region; forming an optical adhesive layer on a side of the plurality of cover plate alignment marks away from the base substrate; and connecting the display substrate formed with the plurality of cover plate alignment marks to the cover plate by using the optical adhesive layer, wherein the base substrate comprised in the display substrate is flat before connecting the display substrate to the cover plate and comprises a curved portion after connecting the display substrate to the cover plate.

For example, the cover plate comprises a window portion in the display region and a light shielding portion located outside the display region, and orthographic projections of the plurality of cover plate alignment marks on the base substrate is in a region where an orthographic projection of the light shielding portion on the base substrate is located.

For example, connecting the display substrate formed with the plurality of cover plate alignment marks to the cover plate by using the optical adhesive layer comprises: irradiating the cover plate and the display substrate by light to align the display substrate with the cover plate.

For example, in a case wherein the cover plate and the display substrate are irradiated by light, a center of the display region of the display substrate is calculated according to the plurality of cover plate alignment marks by using an alignment device, and a center of the window portion of the cover plate is calculated according to an edge of the window portion of the cover plate by using the alignment device; and the center of the display region of the display substrate is aligned with the center of the window portion of the cover plate by using the alignment device to align the display substrate with the cover plate.

Embodiments of the present disclosure further provide an alignment method, which comprises: irradiating a display substrate and a cover plate for forming a display panel by light, in which the display panel has a display region and a frame region at a periphery of the display region; the display panel comprises the display substrate, the cover plate and an optical adhesive layer connecting the display substrate to the cover plate, the display substrate comprises a plurality of cover plate alignment marks, and the cover plate comprises a window portion in the display region and a light shielding portion in the frame region; calculating a center of the display region of the display substrate according to the plurality of cover plate alignment marks; calculating a center of a window portion of the cover plate according to an edge of the window portion of the cover plate; and aligning the center of the display region of the display substrate with the center of the window portion of the cover plate to align the display substrate with the cover plate, in which the display substrate comprises a flexible base substrate and comprises a plurality of light emitting elements, a pixel defining layer, and an encapsulation layer, the plurality of light emitting elements, the pixel defining layer, and the encapsulation layer are on the base substrate, the pixel defining layer separates the plurality of light emitting elements, and the encapsulation layer is on a side of the plurality of light emitting elements away from the base substrate; the optical adhesive layer is on a side of the encapsulation layer away from the base substrate; the cover plate is on a side of the optical adhesive layer away from the display substrate; the encapsulation layer comprises a first inorganic encapsulation layer, a first organic encapsulation layer, and a second inorganic encapsulation layer which are sequentially arranged in a direction away from the base substrate; the frame region comprises a dam glue region where an annular dam glue is located and an annular cutting region which is on a side of the dam glue away from the display region; at least one of the plurality of cover plate alignment marks is overlapped with the second inorganic encapsulation layer in a direction perpendicular to the base substrate, and an orthographic projection of the at least one of the plurality of cover plate alignment marks on the base substrate is between an orthographic projection of the dam glue on the base substrate and the display region, and/or an orthographic projection of at least one of the plurality of cover plate alignment marks on the base substrate is between the orthographic projection of the dam glue and the cutting region.

Embodiments of the present disclosure further provide a display panel, which comprises a display substrate, an optical adhesive layer, and a cover plate. The display substrate comprises a flexible base substrate and comprises a plurality of light emitting elements, a pixel defining layer, and an encapsulation layer, in which the plurality of light emitting elements, the pixel defining layer, and the encapsulation layer are on the base substrate, the pixel defining layer separates the plurality of light emitting elements, and the encapsulation layer is on a side of the plurality of light emitting elements away from the base substrate; the optical adhesive layer is on a side of the encapsulation layer away from the base substrate; and the cover plate is on a side of the optical adhesive layer away from the display substrate and connected with the display substrate through the optical adhesive layer, in which the encapsulation layer comprises a first inorganic encapsulation layer, a first organic encapsulation layer, and a second inorganic encapsulation layer which are sequentially arranged in a direction away from the base substrate; and the display substrate further comprises a plurality of cover plate alignment marks configured for aligning the display substrate with the cover plate, and further comprises a touch structure, the touch structure is between the encapsulation layer and the optical adhesive layer in a direction perpendicular to the base substrate, and the touch structure comprises at least one metal layer, the at least one metal layer comprises the plurality of cover plate alignment marks.

For example, the display panel comprises a display region and a frame region at a periphery of the display region, the frame region comprises a dam glue region where an annular dam glue is located and an annular cutting region on a side of the dam glue away from the display region; at least one of the plurality of cover plate alignment marks is overlapped with the second inorganic encapsulation layer in the direction perpendicular to the base substrate, and an orthographic projection of the at least one of the plurality of cover plate alignment marks on the base substrate is between an orthographic projection of the dam glue on the base substrate and the display region, and/or an orthographic projection of at least one of the plurality of cover plate alignment marks on the base substrate is between the orthographic projection of the dam glue on the base substrate and the cutting region.

In the embodiments of the present disclosure, each of the plurality of cover plate alignment marks 14 can have a larger size without increasing the size of the frame region. In this way, the alignment between the display substrate 10 and the cover plate 30 included in the display panel is facilitated, so that the alignment accuracy can be improved, the phenomenon that an edge of the display region is blurred in a display panel, especially in a curved display panel (for example, a display panel with curved edge regions) can be avoided, and the production efficiency can be improved.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "Upper", "lower", "left" and "right" are only used to express the relative positional relationship. When the absolute position of the described object changes, the relative positional relationship may also change accordingly.

At present, based on the advantages of flexible display of OLED display devices, more and more OLED display devices are designed with two curved lateral edge regions to improve the visual experience of users. The inventor(s) of the present application noticed in a research that the OLED display devices with two curved lateral edge regions are prone to a phenomenon that an edge of the display region is blurred, and found that this phenomenon is caused by low alignment accuracy between an OLED display substrate and a cover plate included in the OLED display devices.

Based on the above findings, the inventor(s) of the present application provides a display panel and a manufacturing method thereof.

As illustrated by FIGS. 1A to 2B, the display panel includes a display substrate 10, an optical adhesive layer 20, and a cover plate 30. The cover plate 30 is located on a side of the optical adhesive layer 20 away from the display substrate 10, and is connected to the display substrate 10 through the optical adhesive layer 20.

Figure 1A:
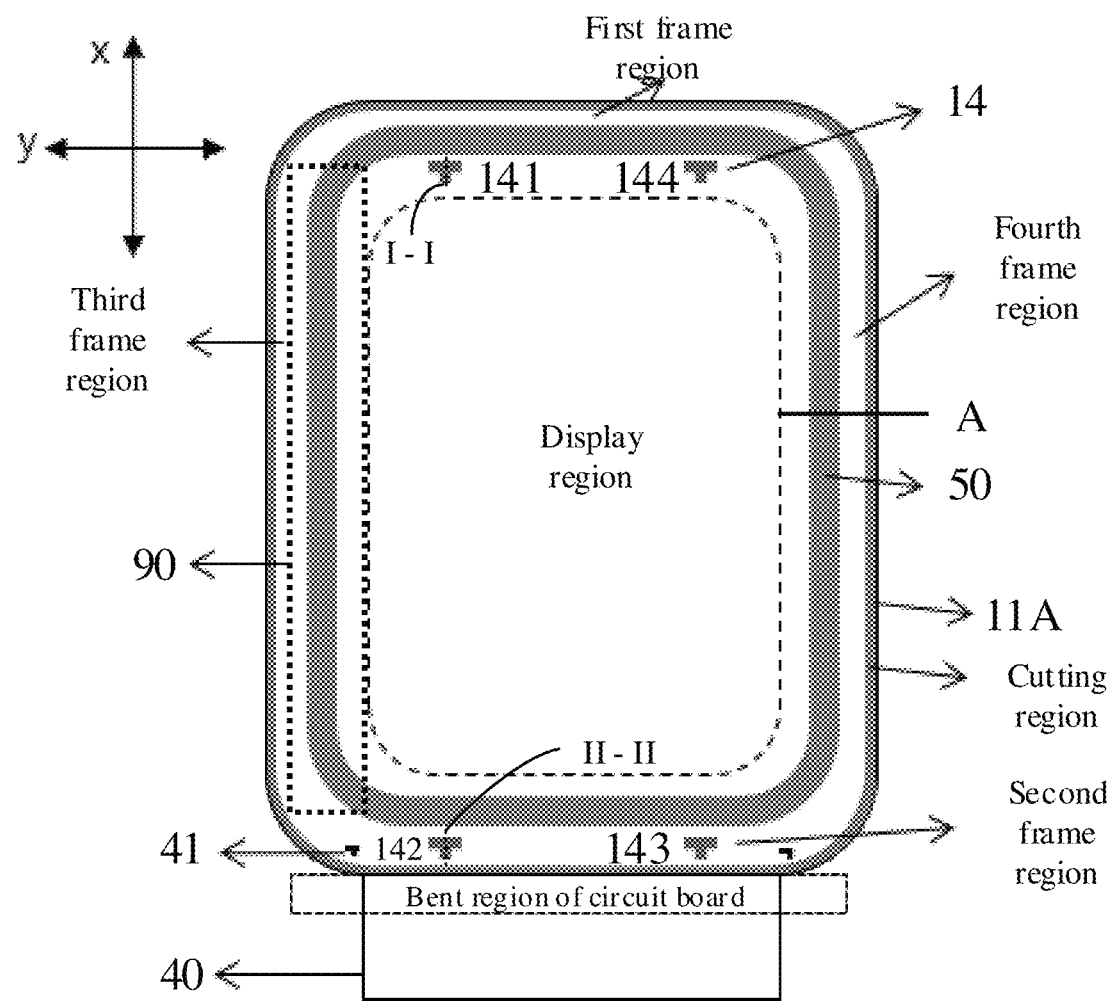
FIG. 1A is a schematic plan view of a display panel provided by an embodiment of the present disclosure.
Figure 1B:
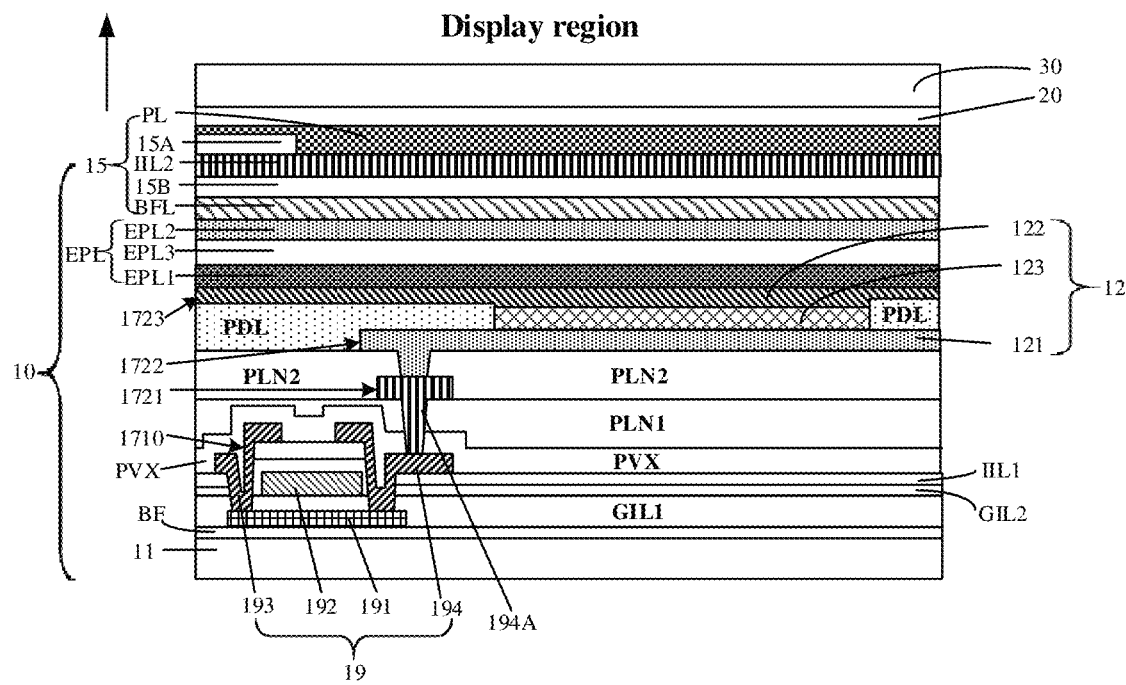
FIG. 1B is a schematic diagram of a positional relationship of some structures in a display region of a display panel provided by an embodiment of the present disclosure.
Figure 1C:
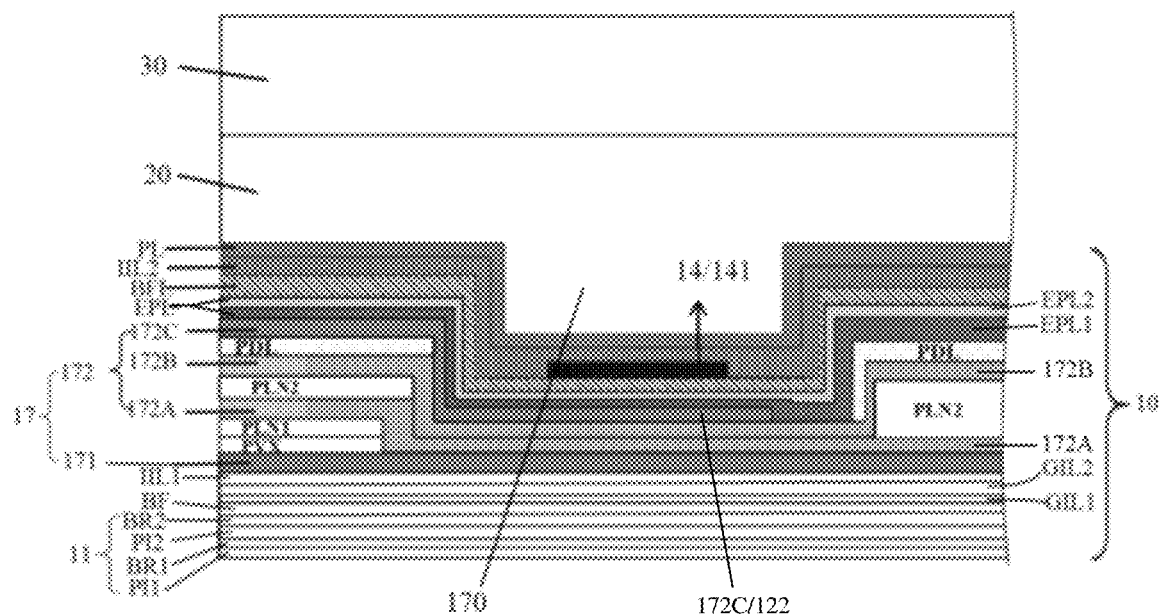
FIG. 1C is a schematic diagram showing the difference between the upper and lower film layers at a cover plate alignment mark and film layers at other positions in a first frame of a display panel provided by an embodiment of the present disclosure.
Figure 1D:
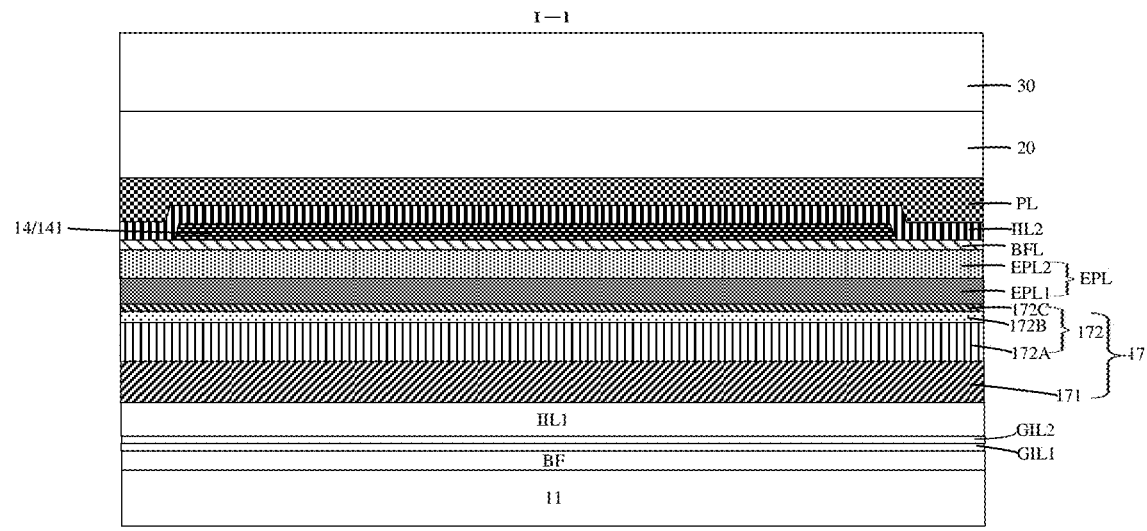
FIG. 1D is a partial cross-sectional view of a part of structures in a first frame region of the display panel provided by an embodiment of the present disclosure at a line I-I in FIG. 1A.
Figure 1E:
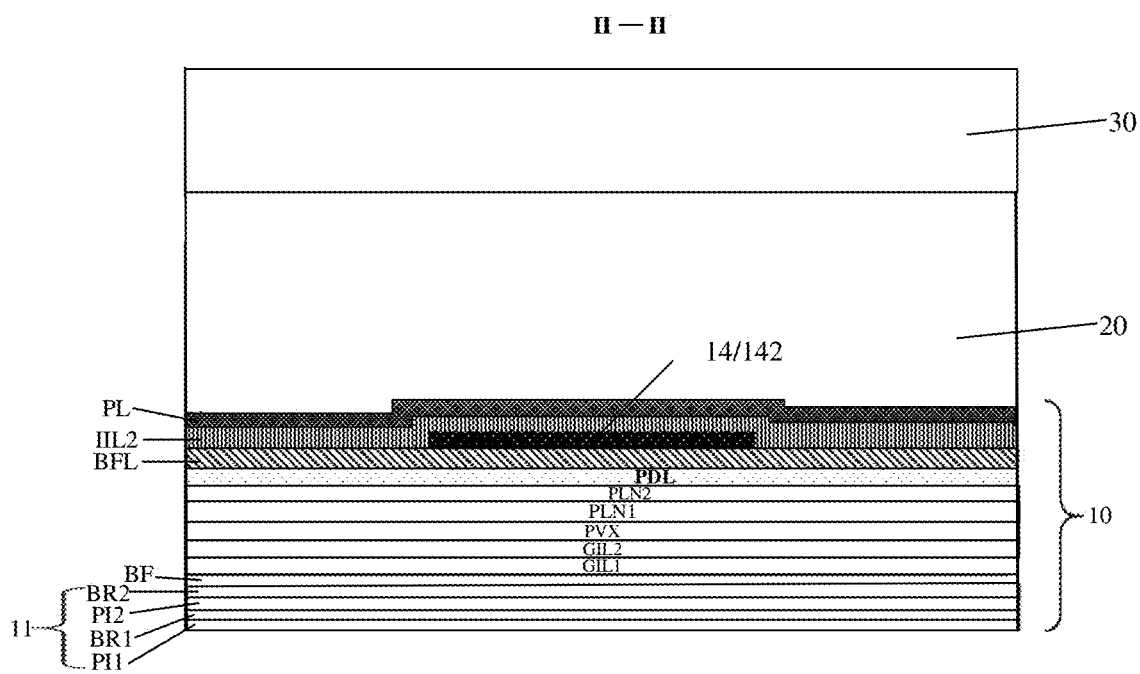
FIG. 1E is a first partial cross-sectional schematic diagram of a part of structures in a second frame region of the display panel provided by an embodiment of the present disclosure at a line II-II in FIG. 1A.
Figure 1F:
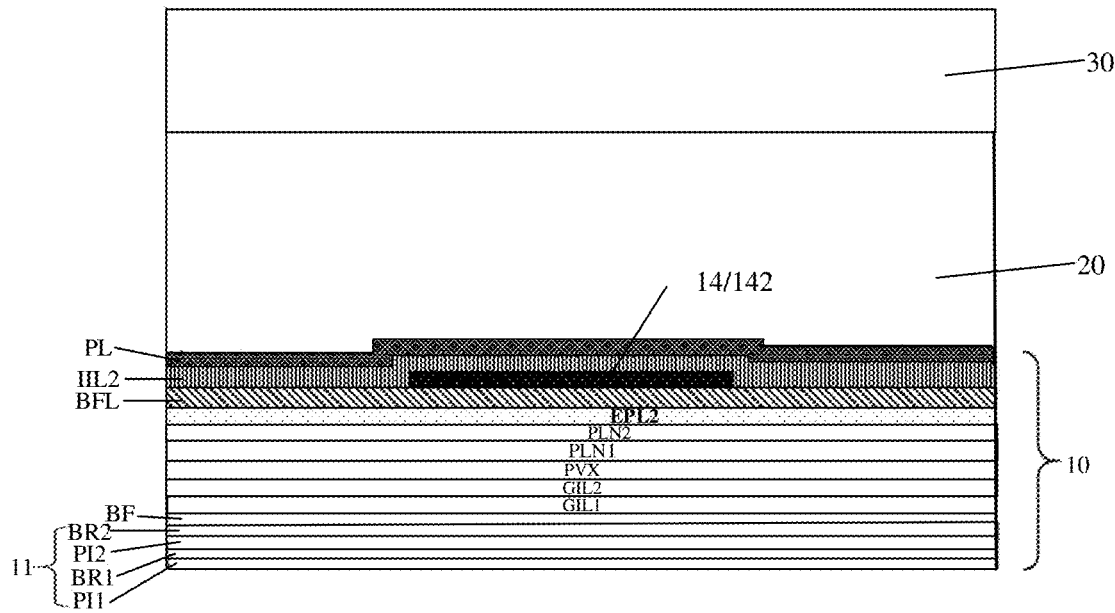
FIG. 1F is a second partial cross-sectional schematic diagram of a part of structures in a second frame region of the display panel provided by an embodiment of the present disclosure at a line II-II in FIG. 1A.
Figure 1G:
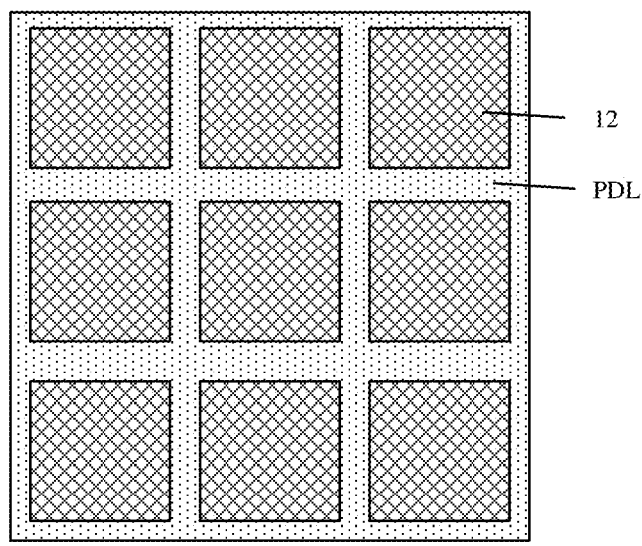
FIG. 1G is a partial schematic plan view of a light emitting element and a pixel defining layer in a display panel provided by an embodiment of the present disclosure.

The display substrate 10 includes a flexible base substrate 11 (not labeled in FIG. 1A), and includes a plurality of light emitting elements 12 (as illustrated by FIG. 1G), a pixel defining layer PDL, and an encapsulation layer EPL, the plurality of light emitting elements 12, the pixel defining layer PDL, and the encapsulation layer EPL are disposed on the base substrate 11. The pixel defining layer PDL is used to separate the plurality of light emitting elements 12 (as illustrated by FIG. 1G), that is, the pixel defining layer PDL is used to define a plurality of sub-pixel regions, each of which is provided with one light emitting element 12.

The display substrate 10 further includes an encapsulation layer EPL, which is located on a side of the plurality of light emitting elements 12 away from the base substrate 11, for preventing water, oxygen and the like in the air from corroding the plurality of light emitting elements 12. In some embodiments, the encapsulation layer EPL includes a first inorganic encapsulation layer EPL1, a first organic encapsulation layer EPL3, and a second inorganic encapsulation layer EPL2 (as illustrated by FIG. 1B) arranged in sequence in a direction away from the base substrate 11, that is, distances from the first inorganic encapsulation layer EPL1, the first organic encapsulation layer EPL3, and the second inorganic encapsulation layer EPL2 to the base substrate 11 gradually increase.

Figure 1H:
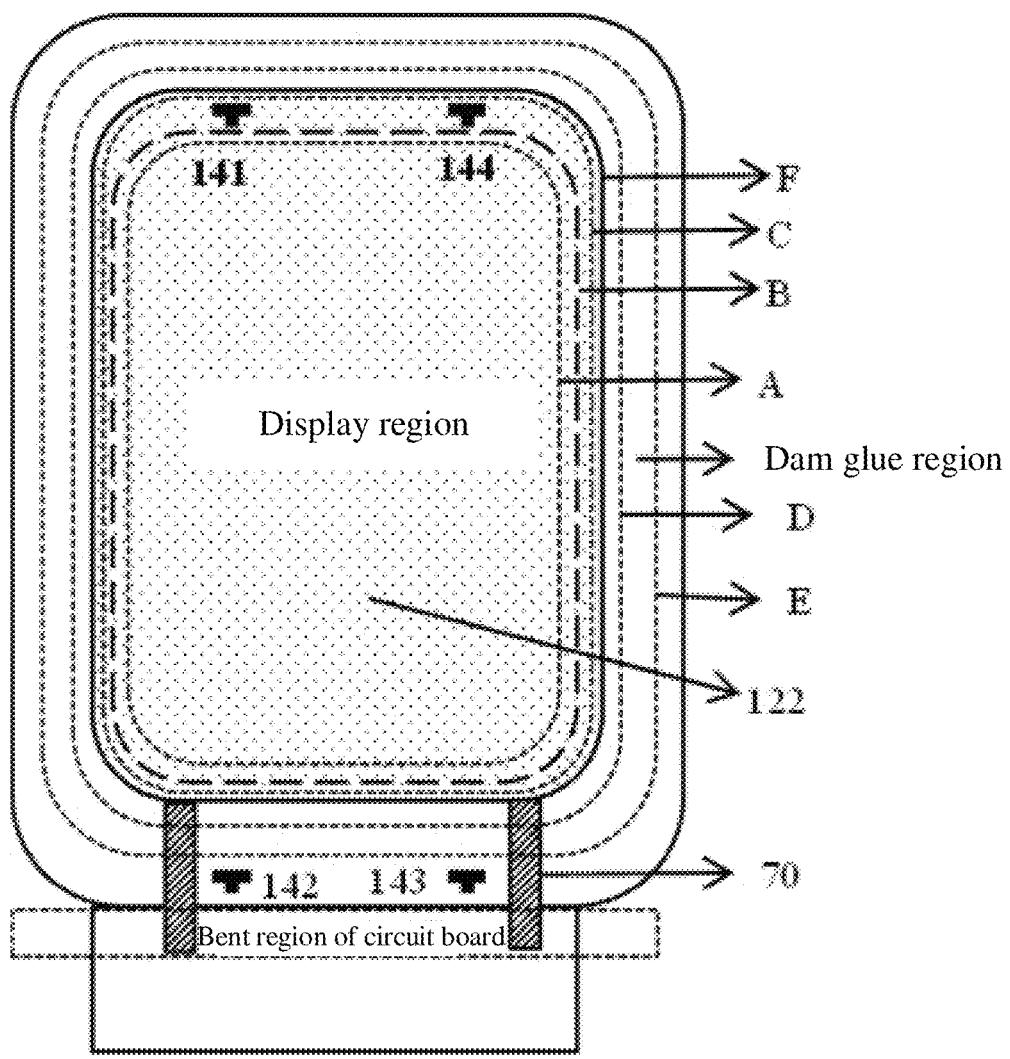
FIG. 1H is a schematic diagram showing a positional relationship of a second electrode layer, a cover plate alignment mark, a display region, a recessed region, and a dam glue region in a display panel provided by an embodiment of the present disclosure.

The display panel includes a display region (i.e., a region surrounded by the dashed line A in FIG. 1A, FIG. 2A and FIG. 1H) and a frame region at a periphery of the display region, the frame region includes a dam glue region where an annular dam glue 50 is located (i.e., a region between the dashed line D and the dashed line E in FIG. 1H) and an annular cutting region outside the dam glue 50 (i.e., the cutting region is located on a side of the dam glue 50 away from the display region, i.e., an orthographic projection of the dam glue 50 on the base substrate 11 is located between the display region and the cutting region).

The display substrate 10 further includes a plurality of cover plate alignment marks 14 configured for aligning the display substrate 10 with the cover plate 30. The plurality of cover plate alignment marks 14 are located in the frame region. By arranging the plurality of cover plate alignment marks 14 in the frame region, it is able to prevent the plurality of cover plate alignment marks 14 from affecting the display effect. In some embodiments, an orthographic projection of at least one of the plurality of cover plate alignment marks 14 on the base substrate is located between the orthographic projection of the dam glue 50 on the base substrate and the display region, that is, between the dam glue region and the display region (as illustrated by FIG. 1A) and the at least one of the plurality of cover plate alignment marks 14 is overlapped with the second inorganic encapsulation layer EPL2 in a direction perpendicular to the base substrate 11 (as illustrated by FIGS. 1C, 1D, 1F, and 2B), and an orthographic projection of at least another one of the plurality of cover plate alignment marks 14 on the base substrate is located between the orthographic projection of the dam glue 50 on the base substrate and the cutting region (as illustrated by FIG. 1A), i.e., is located between the dam glue region and the cutting region.

In some embodiments, with regard to each of the at least one of the plurality of cover plate alignment marks 14 located between the dam glue region and the cutting region, the second inorganic encapsulation layer EPL2 covers all or only a part of the at least one of the plurality of cover alignment marks 14 located between the dam glue region and the display region. Or, as illustrated in FIG. 1C and FIG. 1D, in a direction perpendicular to the base substrate 11, the second inorganic encapsulation layer EPL2 is located between the base substrate 11 and the at least one of the plurality of cover plate alignment marks 14 located between the dam glue region and the display region. That is to say, in some embodiments, with regard to the at least one of the plurality of cover plate alignment marks 14, its orthographic projection on the base substrate is located between the orthographic projection of the dam glue 50 on the base substrate and the display region (as illustrated by FIG. 1A) and the at least one of the plurality of cover plate alignment marks 14 is overlapped with the second inorganic encapsulation layer EPL2 in the direction perpendicular to the base substrate 11 ("overlapped" includes "completely overlapped" and "partially overlapped", and also includes "covering" and "being covered").

Figure 2A:
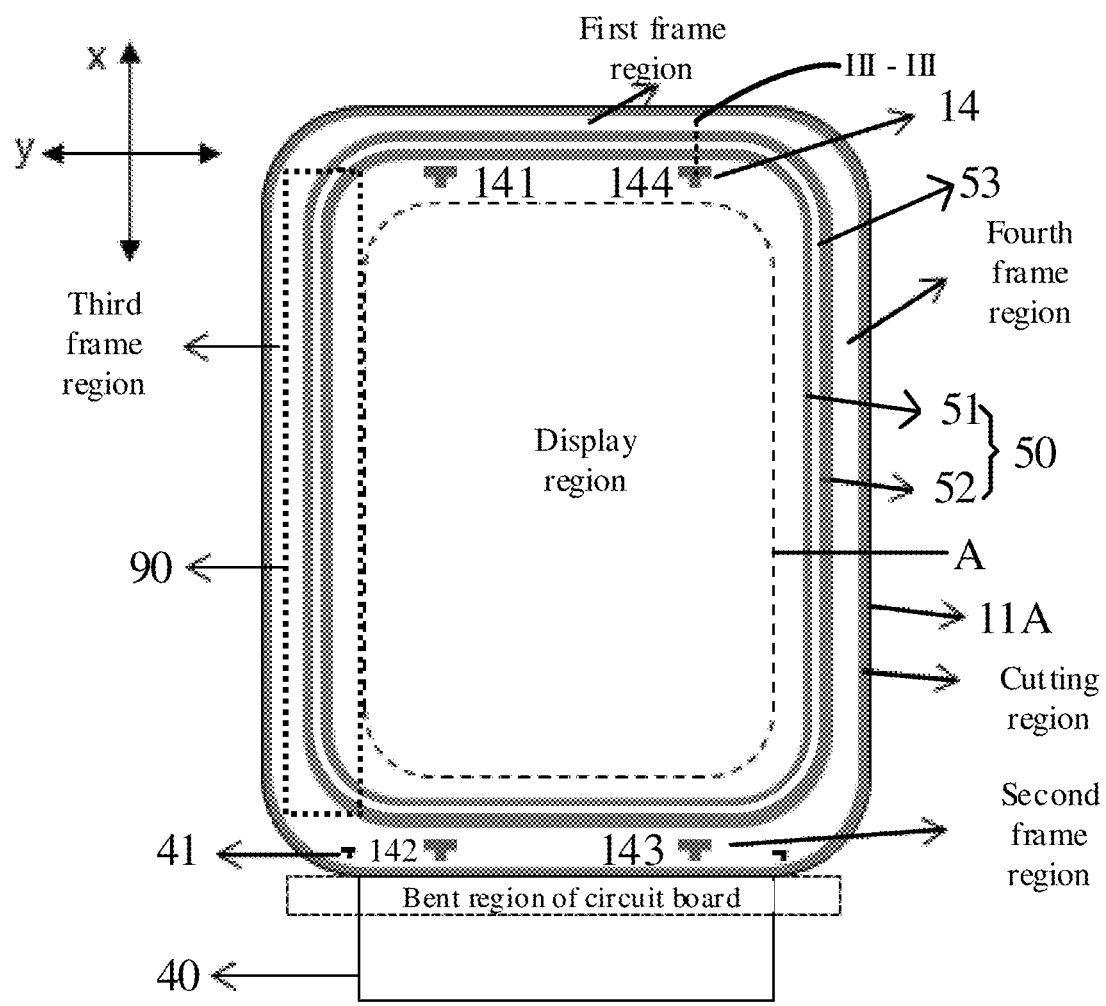
FIG. 2A is a schematic plan view of a dam glue including a first dam glue and a second dam glue in a display panel provided by an embodiment of the present disclosure.
Figure 2B:
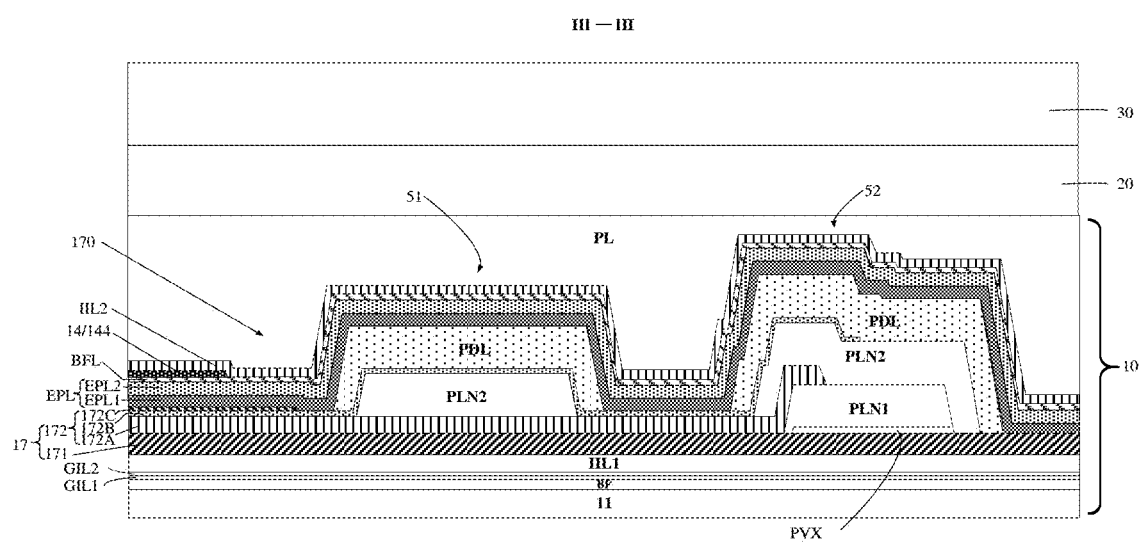
FIG. 2B is a partial cross-sectional schematic diagram of a part of structures in a first frame region of the display panel provided by an embodiment of the present disclosure along a line in FIG. 2A.

In some embodiments, with regard to each of the at least one of the plurality of cover alignment marks 14 of which orthographic projection on the base substrate is located between the orthographic projection of the dam glue 50 on the base substrate and the cutting region, the cover alignment mark 14 is overlapped with (as illustrated by FIG. 1F and FIG. 2B) or not overlapped (as illustrated by FIG. 1E) with the second inorganic encapsulation layer EPL2 in the direction perpendicular to the base substrate 11. In some embodiments, with regard to each of the at least one of the plurality of cover alignment marks 14 of which orthographic projection on the base substrate is located between the dam glue region and the cutting region, the second inorganic encapsulation layer EPL2 covers all or only a part of the at least one of the plurality of cover plate alignment mark 14 located between the dam glue region and the cutting region. That is to say, in some embodiments, with regard to the at least one of the plurality of cover plate alignment marks 14, the orthographic projection of the at least one of the plurality of cover plate alignment marks 14 on the base substrate is located between the orthographic projection of the dam glue 50 on the base substrate and cutting region (as illustrated by FIG. 1A) and the at least one of the plurality of cover plate alignment marks 14 is overlapped with or not overlapped with the second inorganic encapsulation layer EPL2 in the direction perpendicular to the base substrate 11 ("overlapped" includes "completely overlapped" and "partially overlapped", and also includes "covering" and "being covered"). That is to say, in some embodiments, the orthographic projection of the at least one of the plurality of cover plate alignment marks 14 on the base substrate is located between the orthographic projection of the dam glue 50 on the base substrate and the cutting region, that is, is located between the dam glue region and the cutting region.

In some embodiments, the dam glue 50 is used to prevent the organic material used to form the organic encapsulation layer in the encapsulation layer EPL from flowing to the outside of the dam glue 50 in the process of manufacturing the encapsulation layer EPL, and the outside of the dam glue 50 is a region between the dam glue 50 and an edge 11A (as illustrated in FIG. 1A) of the base substrate 11. Because the dam glue 50 is convex, in order to prevent the shape and size of the cover plate alignment mark 14 from being affected by the dam glue 50, the orthographic projection of the cover plate alignment mark 14 on the base substrate 11 is located outside a region where the orthographic projection of the dam glue 50 on the base substrate 11 is located, that is, the cover plate alignment mark 14 is located outside the dam glue region.

In some embodiments, the cutting region is a region close to an edge of the display panel. Because the display panel is obtained by cutting a mother board of the display panel, there is a region close to the edge of the display panel where a surface of the base substrate 11 is rough due to cutting, and this region is called as the cutting region. Because the surface of the cutting region is rough, in order to prevent the cutting region from affecting the shape and size of the cover plate alignment mark 14, orthographic projections of the plurality of cover plate alignment marks 14 on the base substrate 11 are located outside the cutting region. In some embodiments, the cutting region includes a crack blocking member for preventing a crack from spreading to the display region during cutting.

In the embodiments of the present disclosure, because the orthographic projection of at least one of the plurality of cover plate alignment marks 14 included in the display substrate 10 is located between the orthographic projection of the dam glue 50 and the display region and/or the orthographic projection of at least one of the plurality of cover plate alignment marks 14 is located between the orthographic projection of the dam glue 50 and the cutting region, each of the plurality of cover plate alignment marks 14 can have a larger size without increasing the size of the frame region. In this way, the alignment between the display substrate 10 and the cover plate 30 included in the display panel is facilitated, so that the alignment accuracy can be improved, the phenomenon that an edge of the display region is blurred in a display panel, especially in a curved display panel (for example, a display panel with curved edge regions) can be avoided, and the production efficiency can be improved.

It should be noted that, in the embodiments of the present disclosure, a component A is located on a side of a component B away from the base substrate, which refers to that the component B is located between the component A and the base substrate in the direction perpendicular to the base substrate. A component C is overlapped with a component D or the component C is overlapped with the component D in the direction perpendicular to base substrate 11, which refers to that an orthographic projection of the component C on base substrate 11 is at least partially overlapped with an orthographic projection of the component D on base substrate 11.

For example, as illustrated in FIG. 1A, the plurality of cover plate alignment marks 14 included in the display substrate 10 include four cover plate alignment marks 141 to 144, in which orthographic projections of two cover plate alignment marks 141 and 144 on the base substrate are located between the orthographic projection of the dam glue 50 on the base substrate and the display region, and orthographic projections of the other two cover plate alignment marks 142 and 143 on the base substrate are located between the orthographic projection of the dam glue 50 on the base substrate and the cutting region. It should be noted that, in the embodiment shown in FIG. 1A, the case where the display substrate 10 includes four cover plate alignment marks 14 is taken as an example to illustrate. In other embodiments, the display substrate 10 may include other numbers of cover plate alignment marks 14.

The encapsulation layer EPL includes at least two inorganic encapsulation layers and at least one organic encapsulation layer. In the case where the encapsulation layer EPL includes at least two inorganic encapsulation layers and at least two organic encapsulation layers, the inorganic encapsulation layers and the organic encapsulation layers are alternately arranged. For example, the first inorganic encapsulation layer EPL1 and the second inorganic encapsulation layer EPL2 are the outermost inorganic encapsulation layers of the encapsulation layer EPL. For example, as illustrated in FIG. 1B, the encapsulation layer EPL only includes a first inorganic encapsulation layer EPL1 and a second inorganic encapsulation layer EPL2 which are stacked and a first organic encapsulation layer EPL3 located between the first inorganic encapsulation layer EPL1 and the second inorganic encapsulation layer EPL2, and the first organic encapsulation layer EPL3 directly contacts the first inorganic encapsulation layer EPL1 and the second inorganic encapsulation layer EPL2. For example, the encapsulation layer EPL includes a second organic encapsulation layer and a third inorganic encapsulation layer in addition to the first inorganic encapsulation layer EPL1, the first organic encapsulation layer EPL2, and the second inorganic encapsulation layer EPL2 which are sequentially stacked, so that the encapsulation layer EPL includes the first inorganic encapsulation layer EPL1, the second organic encapsulation layer, the third inorganic encapsulation layer, the first organic encapsulation layer EPL2, and the second inorganic encapsulation layer EPL2 which are sequentially stacked. Or, the encapsulation layer EPL includes a first inorganic encapsulation layer EPL1, a first organic encapsulation layer EPL3, a third inorganic encapsulation layer, a second organic encapsulation layer and a second inorganic encapsulation layer EPL2 which are sequentially stacked. In other embodiments, the encapsulation layer EPL may also include more inorganic encapsulation layers and more organic encapsulation layers.

It should be noted that, in at least one embodiment, at least one inorganic encapsulation layer included in the encapsulation layer EPL may extend to a region where the dam glue 50 is located (that is, the at least one inorganic encapsulation layer may be at least partially overlapped with the dam glue 50 in the direction perpendicular to the base substrate 11). For example, as illustrated in FIG. 2B, the first inorganic encapsulation layer EPL1 and the second inorganic encapsulation layer EPL2 included in the encapsulation layer EPL are overlapped with the dam glue 50. In other embodiments, only the second inorganic encapsulation layer EPL2 is at least partially overlapped with the dam glue 50. Or, the whole encapsulation layer EPL is not overlapped with the dam glue 50 (that is, the whole orthographic projection of the encapsulation layer EPL on the base substrate 11 is located outside the orthographic projection of the dam glue 50 on the base substrate 11).

For example, as illustrated in FIG. 2A and FIG. 2B, the dam glue region where the dam glue 50 is located is provided with a first dam glue 51 and a second dam glue 52 arranged in a direction parallel to the base substrate 11 (i.e., the dam glue 50 includes a first dam glue 51 and a second dam glue 52), the second dam glue 52 is farther away from the display region than the first dam glue 51, and a height of the second dam glue 52 (i.e., a largest distance from the top of the second dam glue 52 to the base substrate 11) is larger than a height of the first dam glue 51 (a largest distance from the top of the first dam glue 51 to the base substrate 11). For example, the first dam glue 51 includes portions of the following layers extending into the frame region: the second planarization insulating layer PLN2, the pixel defining layer PDL, the first inorganic encapsulation layer EPL1, the second inorganic encapsulation layer EPL2, the buffer layer BFL, and the second intermediate insulating layer IIL2. The second dam glue 52 includes portions of the following layers extending into the frame region: the first planarization insulating layer PLN1, the second planarization insulating layer PLN2, the pixel defining layer PDL, the first inorganic encapsulation layer EPL1, the second inorganic encapsulation layer EPL2, the buffer layer BFL, and the second intermediate insulating layer IIL2. The dam glue 50 further includes a concave structure between the first dam glue 51 and the second dam glue 52, and portions between the first dam glue 51 and the second dam glue 52 belonging to organic film layers such as the pixel defining layer PDL, the planarization insulating layers PLN1 and PLN2 are removed as much as possible to form an annular groove region 53, as illustrated in FIG. 2A. That is, the organic film layers such as the pixel defining layer PDL, the planarization insulating layers PLN1 and PLN2 are disconnected (i.e., discontinuous) at the groove region 53. Furthermore, after the encapsulation of the display panel is completed, the encapsulation layer EPL as formed can effectively prevent water vapor or oxygen from penetrating into the inside of the light emitting elements of the display panel. Embodiments of the dam glue 50 include but are not limited to the embodiments shown in FIG. 2A and FIG. 2B.

For example, as illustrated in FIG. 1C, FIG. 1E, and FIG. 1F, the base substrate 11 includes a first polyimide layer PI1, a first inorganic layer BR1, a second polyimide layer PI2, and a second inorganic layer BR2 stacked in sequence. The base substrate 11 in FIG. 1B, FIG. 1D and FIG. 2B also adopts the same structure as the base substrate 11 shown in FIG. 1C, FIG. 1E and FIG. 1F. In other embodiments, the base substrate 11 may be formed of other materials.

For example, in at least one embodiment of the present disclosure, the light emitting element 12 included in the display substrate 10 is a self-luminous element such as an OLED or a quantum dot light emitting element. For example, the light emitting element 12 is a top emission type, that is, light emitted from the light emitting element 12 is emitted in a direction away from the base substrate 11 (as shown by an arrow direction in FIG. 1B). For example, as illustrated in FIG. 1B, the light emitting element 12 includes a first electrode layer 121, a second electrode layer 122, and a light emitting layer 123 located between the first electrode layer 121 and the second electrode layer 122, one of the first electrode layer 121 and the second electrode layer 122 is an anode and the other one is a cathode. In FIG. 1B, the case where the first electrode layer 121 is an anode and the second electrode layer 122 is a cathode is described as an example, that is, as illustrated in FIG. 1B, the light emitting element 12 includes an anode 121, a light emitting layer 123, and a cathode 122. In the direction perpendicular to the base substrate 11, the light emitting layer 123 is located between the anode 121 and the cathode 122, the anode 121 is located between the light emitting layer 123 and the base substrate 11, and the cathode 122 is located on a side of the light emitting layer 123 away from the base substrate 11. In other embodiments, positions of the anode 121 and the cathode 122 may be interchanged. To better prevent the light emitting element 12 from being corroded by water and oxygen in the air, for example, the cathode 122 of the light emitting element 12 directly contacts the encapsulation layer EPL. In order to avoid affecting the display effect, for example, both the first electrode layer 121 and the second electrode layer 122 are transparent.

For example, as illustrated in FIG. 1B, the display substrate 10 further includes a switching element 19 electrically connected to the light emitting element 12 to control the operating state of the light emitting element 12. For example, the switching element 19 is a transistor, which includes an active layer 191, a gate electrode 192, a source electrode 193, and a drain electrode 194. The gate electrode 192 is insulated from the active layer 191 by a gate electrode insulating layer GIL, the source electrode 193 and drain electrode 194 are insulated from the gate electrode 192 by an intermediate insulating layer IIL1, and the source electrode 193 and drain electrode 194 extend through through-holes in the first gate insulating layer GIL1, the second gate electrode insulating layers GIL2, and the first intermediate insulating layer IIL1 to be electrically connected with the active layer 191.

For example, each of the plurality of sub-pixel regions included in the display substrate 10 includes a light emitting element 12 and a switching element 19 electrically connected to the light emitting element 12; as illustrated in FIG. 1B, the switching element 19 is electrically connected to the first electrode layer 121 of the light emitting element 12 through the drain electrode 194. In this case, the first electrode layers 121 of the plurality of light emitting elements 12 in the plurality of sub-pixel regions are disconnected from each other, that is, the first electrode layers 121 located in different sub-pixel regions are disconnected from each other. In addition, the second electrode layers 122 of the plurality of light emitting elements 12 in the plurality of sub-pixel regions are disconnected or directly connected with each other. In the case that the second electrode layers 122 of the plurality of light emitting elements 12 in the plurality of sub-pixel regions are directly connected, the plurality of light emitting elements 12 in the plurality of sub-pixel regions share the same second electrode layer 122. As illustrated in FIG. 1H, an orthographic projection of an edge F of the shared second electrode layer 122 on the base substrate is located between the display region and the dam glue region (i.e., the edge F is located between the dashed line A and the dashed line D), and the second electrode layer 122 is continuous and covers the entire display region, which can simplify wiring.

For example, as illustrated in FIG. 1B, the display substrate 10 further includes a first planarization insulating layer PLN1 and a second planarization insulating layer PLN2 covering the switching element 19, the second planarization insulating layer PLN2 is located on a side of the first planarization insulating layer PLN1 away from the base substrate 11, and the second planarization insulating layer PLN2 has a substantially flat surface, so that the light emitting layer 123 of the light emitting element 12 is formed on the substantially flat surface. For example, the first electrode layer 121 of the light emitting element 12 extends into a through-hole penetrating the second planarization insulating layer PLN2 to be electrically connected with a connection portion 194A, and the connection portion 194A extends into a through-hole penetrating the first planarization insulating layer PLN1 and the passivation insulating layer PVX to be electrically connected with the switching element 19, so that the first electrode layer 121 is electrically connected with the switching element 19 through the connection portion 194A. In addition, "substantially flat" herein does not require 100% flat, but refers to that the surface directly bearing the cover plate alignment marks 14 is substantially flat, that is, the roughness of the surface meets the allowable error in the thin film manufacturing process.

For example, as illustrated in FIG. 1A and FIG. 2A, in the display panel provided by at least one embodiment of the present disclosure, the frame region includes a first frame region and a second frame region which are opposite in the first direction x, and a third frame region and a fourth frame region which are opposite in the second direction y. The display panel further includes a flexible circuit board 40 connected with the second frame region, and the flexible circuit board 40 is electrically connected with signal lines in the display region to achieve signal transmission. For example, as illustrated in FIG. 1H, a lead line 70 (the number of the lead line 70 may be one or more; the lead line 70 is not overlapped with the cover plate alignment marks 142, 143, for example) is electrically connected with the second electrode layer 122 of the light emitting element 12 (not shown in FIG. 1H), so that an electrical signal is applied to the second electrode layer 122 through the lead line 70.

It should be noted that FIG. 1A shows a schematic diagram of the flexible circuit board 40 in an unfolded state; after the product is assembled, a portion of the flexible circuit board 40 located in a bent region of the circuit board is bent to bend the flexible circuit board 40 to a back side of the display panel. In addition, the embodiment shown in FIG. 1A is described only by taking the case where the planar shape of the display panel is a rectangle as an example; in other embodiments, the planar shape of the display panel can be diamond, circle, and other needed shapes.

Figure 3A:
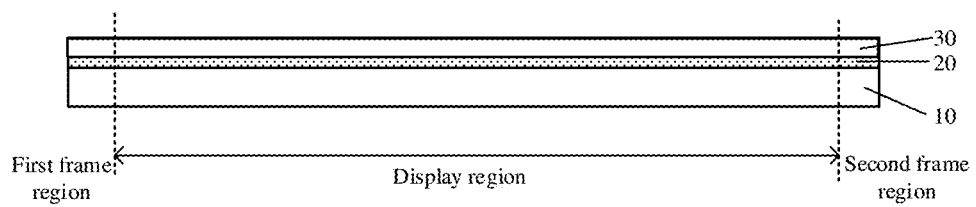
FIG. 3A is a partial cross-sectional schematic diagram along a first direction x in FIG. 1A.
Figure 3B:
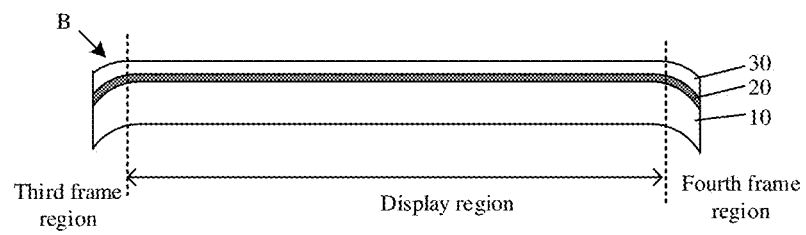
FIG. 3B is a partial sectional schematic diagram along a second direction y in FIG. 1A.

For example, in at least one embodiment of the present disclosure, both two lateral edge regions of the display panel are curved. For example, as illustrated in FIG. 3A and FIG. 3B, in the first direction x, the display panel is flat in the first frame region and the second frame region; in the second direction y, the display panel is curved in the third frame region and the fourth frame region. In some embodiments, in the first direction x, the display panel is flat in at least one of the first frame region and the second frame region; in the second direction y, the display panel is curved in at least one of the third frame region and the fourth frame region. That is, the display panel includes a curved portion B in at least one of the third frame region and the fourth frame region, and a portion of the cover plate 30 corresponding to the curved portion B is curved, as illustrated in FIG. 3B. By adopting the design that the lateral edge region is curved, the visual experience of the user can be improved upon the user watching the display panel. It should be noted that, the embodiments shown in FIG. 3A and FIG. 3B are only illustrated by taking the case where the display panel is curved in the third frame region and the fourth frame region and is flat (non-curved) in the whole display region as an example. Embodiments of the present disclosure include but are not limited to the embodiments shown in FIG. 3A and FIG. 3B; For example, the display panel may be curved only in one of the third frame region and the fourth frame region.

For example, at least one of the first frame region and the second frame region is provided with the cover plate alignment mark 14. In the embodiments of the present disclosure, because the second frame region is located on a side of the display panel where the flexible circuit board 40 is arranged, the second frame region has a larger width (i.e., the size along the first direction X), so that the signal lines extending from the display region directly enter the second frame region to be electrically connected with the flexible circuit board 40, and it is convenient for the signal lines led out from the third frame region and the fourth frame region to be electrically connected with the flexible circuit board 40 at the second frame region. Furthermore, the first frame region opposite to the second frame region also has a larger width (i.e., the size along the first direction x), so that the signal lines extending from the display region first enter the first frame region, and then enter the second frame region after passing through the third frame region or the fourth frame region to be electrically connected with the flexible circuit board 40. In the embodiments of the present disclosure, because the cover plate alignment mark 14 is provided in at least one of the first frame region and the second frame region with a larger width, the cover plate alignment mark 14 may have a larger size to improve the identifiability of the cover plate alignment mark 14, thereby improving the alignment accuracy.

For example, as illustrated in FIG. 1A, the display panel further includes a gate electrode driver 90 for supplying a gate electrode scanning signal to the display region, the gate electrode driver 90 is located in at least one of the third frame region and the fourth frame region. Because the gate electrode driver 90 is arranged in the third frame region and/or the fourth frame region, and the free space of the third frame region and/or the fourth frame region is small, the cover plate alignment mark 14 is located outside the third frame region and the fourth frame region.

Figure 4:
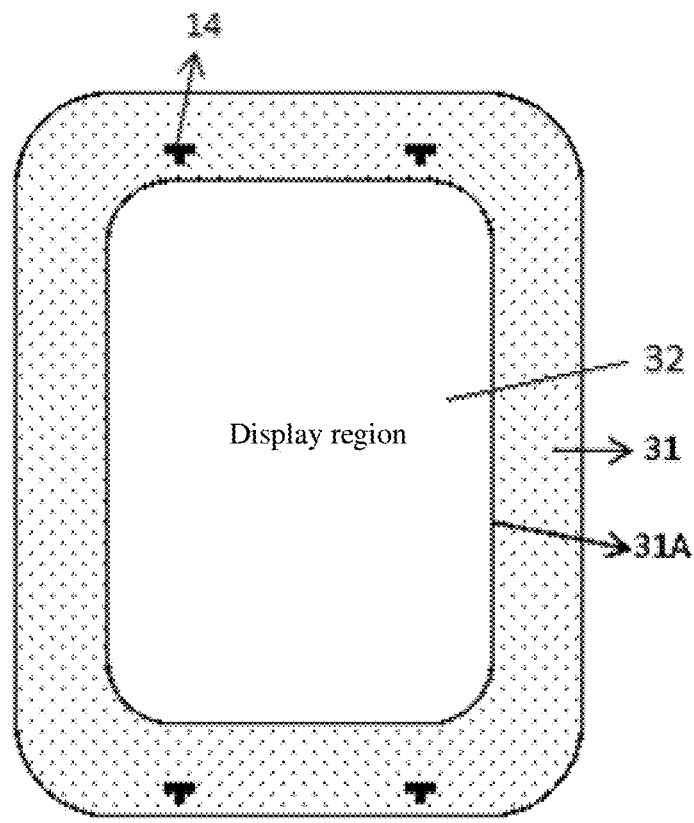
FIG. 4 is a schematic plan view of a cover plate in a display panel provided by an embodiment of the present disclosure.

In an embodiment of the present disclosure, for example, the alignment between the display substrate and the cover plate can be performed in such a way that an alignment device acquires a center of the display region of the display substrate and a center of the display region of the cover plate. For example, as illustrated in FIG. 4, the cover plate 30 includes a transparent window portion 32 located in the display region and a light shielding portion 31 (such as ink and other light shielding materials) located outside the display region to shield structures in the frame region, so as to prevent the structures in the frame region from being seen by users, and an inner edge 31A of the light shielding portion 31 is located at the edge of the display region. The orthographic projections of the plurality of cover plate alignment marks 14 on the base substrate 11 are located in a region where an orthographic projection of the light shielding portion 31 on the base substrate 11 is located. For example, upon light irradiating the display panel, the alignment device can calculate the center of the display region of the display substrate 10 according to the plurality of cover plate alignment marks 14 included in the display substrate 10, and the alignment device can calculate the center of the display region of the cover plate 30 according to the edge 31A of the display region. The alignment device can achieve the alignment between the display substrate 10 and the cover plate 30 by aligning the center of the display region of the display substrate 10 with the center of the display region of the cover plate 30.

For example, in order to simplify the calculation, the orthographic projections of the plurality of cover plate alignment marks 14 included in the display substrate 10 on the base substrate 11 have consistent shapes and profiles. In order to further simplify the calculation, the shapes and profiles of the orthographic projections of the plurality of cover plate alignment marks can be consistent, and the shapes and sizes of the orthographic projections of the plurality of cover plate alignment marks are consistent. In other embodiments, the shapes and profiles of the orthographic projections of the plurality of cover plate alignment marks are consistent and at least some of the cover plate alignment marks are inconsistent in shapes and sizes.

For example, as illustrated in FIG. 1A, at least one of the plurality of cover plate alignment marks 14 included in the display substrate 10 is located in the first frame region and at least another one of the plurality of cover plate alignment marks 14 is located in the second frame region, that is, both the first frame region and the second frame region are provided with cover plate alignment marks 14. For example, as illustrated in FIG. 1A, at least one of the plurality of cover plate alignment marks 14 is located in the first frame region and the orthographic projection of the at least one of the plurality of cover plate alignment marks 14 is located between the orthographic projection of dam glue 50 on the base substrate and the display region, while at least another one of the plurality of cover plate alignment marks 14 is located in the second frame region and the orthographic projection of the at least another one of the plurality of cover plate alignment marks 14 is located between the orthographic projection of dam glue 50 on the base substrate and the cutting region. For example, in other embodiments, only the first frame region is provided with at least one cover plate alignment mark 14 of which the orthographic projection is located between the orthographic projection of the dam glue 50 and the display region; or, only the second frame region is provided with at least one cover plate alignment mark 14 of which the orthographic projection is located between the orthographic projection of the dam glue 50 and the cutting region.

For example, as illustrated in FIG. 1A, the plurality of cover plate alignment marks 14 include four cover plate alignment marks 141 to 144, which are distributed in the frame region close to the four corners of the display region. The four cover plate alignment marks 14 are respectively numbered as a first cover plate alignment mark 141, a second cover plate alignment mark 142, a third cover plate alignment mark 143, and a fourth cover plate alignment mark 144 in a counterclockwise direction. The first cover plate alignment mark 141 and the fourth cover plate alignment mark 144 are located in the first frame region, and the second cover plate alignment mark 142 and the third cover plate alignment mark 143 are located in the second frame region. Furthermore, a combination of the first cover plate alignment mark 141 and the second cover plate alignment mark 142 is symmetrical with a combination of the third cover plate alignment mark 143 and a fourth cover plate alignment mark 144 with respect to an axis parallel to the first direction x (the axis passes through the center of the display region of the display substrate 10 and is parallel to the first direction x, and is not shown in the figure). The symmetrical design is beneficial to simplify the calculation of the alignment device.

It should be noted that different cover plate alignment marks located in the same frame region can be set in the same way. For example, the first cover plate alignment mark 141 and the fourth cover plate alignment mark 144 located in the first frame region can be arranged in the manner shown in the embodiments shown in FIG. 1C, FIG. 1D and FIG. 2B. The second cover plate alignment mark 142 and the third cover plate alignment mark 143 located in the second frame region can be arranged in the manner shown in the embodiments shown in FIG. 1E and FIG. 1F.

For example, in order to further simplify the calculation, the first cover plate alignment mark 141 and the fourth cover plate alignment mark 144 are located in the same horizontal direction (referring to the second direction y in FIG. 1A), the second cover plate alignment mark 142 and the third cover plate alignment mark 143 are located in the same horizontal direction, and the first second cover plate alignment mark 141 and second cover plate alignment mark 142 are located in the same vertical direction (referring to first direction x in FIG. 1A), and the third cover plate alignment mark 143 and the fourth cover plate alignment mark 144 are located in the same vertical direction.

Because the distance between the dam glue 50 and the display region is relatively large in the first frame region, for example, in order to make the cover plate alignment mark 14 have a relatively large size without increasing the size of the frame region, at least one of the plurality of cover plate alignment marks 14 (taking the cover plate alignment marks 141 and 144 as an example in FIG. 1A) included in the display substrate 10 is located in the first frame region and between the dam glue 50 and the display region. In this case, for example, as illustrated in FIG. 1C, FIG. 1D, and FIG. 2B, the cover plate alignment mark 14 (for example, at least one of the cover plate alignment marks 141 and 144 in FIG. 1A) located in the first frame region and between the dam glue 50 and the display region is located on a side of the encapsulation layer EPL away from the base substrate 11. For example, as illustrated in FIG. 1C, FIG. 1D, and FIG. 2B, a portion of the encapsulation layer EPL overlapping with the cover plate alignment mark 14 does not include the first organic encapsulation layer EPL3.

Because the distance between the dam glue 50 and the cutting region is relatively large in the second frame region, for example, in order to make the cover plate alignment mark 14 have a relatively large size without increasing the size of the frame region, at least another one of the plurality of cover plate alignment marks 14 (taking the cover plate alignment marks 142 and 143 as an example in FIG. 1A) is located in the second frame region and between the dam glue 50 and the cutting region. In this case, in at least one embodiment, the whole encapsulation layer EPL2 does not exceed the dam glue 50, and as illustrated in FIG. 1E, the cover plate alignment mark 14 (for example, at least one of the cover plate alignment marks 142 and 143 in FIG. 1A) located in the second frame region and between the dam glue 50 and the cutting region is overlapped with the pixel defining layer PDL and is located on a side of the pixel defining layer PDL away from the base substrate 11, that is, at least one of the cover plate alignment marks 14 located between the dam glue 50 and the cutting region is not overlapped with the second inorganic encapsulation layer EPL2 in the direction perpendicular to the base substrate 11.

In other embodiments, at least one of the plurality of cover plate alignment marks 14 located between the dam glue 50 and the cutting region is at least partially overlapped with the second inorganic encapsulation layer EPL2 in the direction perpendicular to the base substrate 11. For example, in at least another embodiment, the second inorganic encapsulation layer EPL2 in the encapsulation layer EPL exceeds the dam glue 50, and as illustrated in FIG. 1F, the cover plate alignment mark 14 (for example, at least one of the cover plate alignment marks 142 and 143 in FIG. 1A) located in the second frame region and between the dam glue 50 and the cutting region is overlapped with the second inorganic encapsulation layer EPL2 and is located on a side of the second inorganic encapsulation layer EPL2 away from the base substrate 11. Or, in at least another embodiment, the second inorganic encapsulation layer EPL2 in the encapsulation layer EPL exceeds the dam glue 50, and the cover alignment mark 14 (for example, at least one of the cover alignment marks 142 and 143 in FIG. 1A) located in the second frame region and between the dam glue 50 and the cutting region is overlapped with the pixel defining layer PDL and the second inorganic encapsulation layer EPL2 and is located on a side of the second inorganic encapsulation layer EPL2 away from the base substrate 11.

It should be noted that, in FIG. 1F, a case where the whole cover plate alignment mark 14 located in the second frame region and between the dam glue region and the cutting region where the dam glue 50 is located is overlapped with (i.e., completely overlapped) with the second inorganic encapsulation layer EPL2 and is not overlapped with the pixel definition layer PDL is described as an example. In some embodiments, the whole cover plate alignment mark 14 between the dam glue region and the cutting region may be overlapped with the second inorganic encapsulation layer EPL2 and overlapped with the pixel defining layer PDL. In some embodiments, a part of the cover alignment mark 14 is overlapped with the second inorganic encapsulation layer EPL2 and the other part is not overlapped with the second inorganic encapsulation layer EPL2 (i.e., the cover alignment mark 14 is only partially overlapped with the second inorganic encapsulation layer EPL2) and is overlapped with or is not overlapped with the pixel definition layer PDL. In other embodiments, at least one of the plurality of the cover plate alignment marks 14 of which the orthographic projection on the base substrate 11 is located between the dam glue region and the cutting region is not overlapped with the second inorganic encapsulation layer EPL2 in the direction perpendicular to the base substrate 11 and is located on a side of the pixel defining layer PDL away from the base substrate 11 (as illustrated in FIG. 1E). In other embodiments, at least one of the plurality of cover alignment marks 14 of which the orthographic projection is located between the dam glue region and the cutting region is not overlapped with the second inorganic encapsulation layer EPL2 and the pixel defining layer PDL and is located on a side of a buffer layer BFL included in a touch structure 15 (as illustrated in FIG. 1B) away from the base substrate 11.

That is to say, with regard to at least one of the plurality of cover alignment marks 14 of which orthographic projection on the base substrate 11 is located between the dam glue region and the cutting region (as illustrated in FIG. 1A), the at least one of the plurality of cover alignment marks 14 is not overlapped or at least partially overlapped with the second inorganic encapsulation layer EPL2 in the direction perpendicular to the base substrate 11 (the at least one of the plurality of cover alignment marks 14 is located on a side of the second inorganic encapsulation layer EPL2 facing the base substrate 11 or on a side of the second inorganic encapsulation layer EPL2 away from the base substrate 11); and/or, with regard to the at least one of the plurality of cover plate alignment marks 14 of which orthographic projection on the base substrate 11 is located between the dam region and the cutting region (as illustrated in FIG. 1A), the at least one of the plurality of cover alignment marks 14 is at least partially overlapped with the pixel defining layer PDL in the direction perpendicular to the base substrate 11 and is located on a side of the pixel defining layer PDL away from the base substrate 11, or is not overlapped with the pixel defining layer PDL.

For example, the cover plate alignment mark 14 is formed on a flat surface, that is, the surface of the display substrate 10 directly bearing the cover plate alignment mark 14 is a flat surface. For example, as illustrated in FIG. 1C, FIG. 1D and FIG. 2B, in the first frame region (for example, between the dam glue 50 and the display region as illustrated in FIG. 1A), the surface directly bearing the cover plate alignment mark 14 is a part of the surface of the buffer layer BFL away from the base substrate 11 (i.e., the upper surface), and this part of the surface of the buffer layer BFL is flat. For example, as illustrated in FIG. 1E and FIG. 1F, in the second frame region (for example, between the dam glue 50 and the cutting region as illustrated in FIG. 1A), the surface directly bearing the cover plate alignment mark 14 is a part of the surface of the buffer layer BFL away from the base substrate 11, and this part of the surface of the buffer layer BFL is flat. In the embodiments of the present disclosure, by making the surface directly bearing the cover plate alignment mark 14 be a flat surface, it is beneficial to improve the alignment accuracy. It should be noted that "the surface directly bearing the cover plate alignment mark 14" refers to that the surface is located between the base substrate 11 and the cover plate alignment mark 14 in the direction perpendicular to the base substrate 11, and the surface directly contacts the cover plate alignment mark 14. In addition, "flat" here does not require to be 100% flat, but refers to that the surface directly bearing the cover plate alignment mark 14 is substantially flat, that is, the roughness of the surface meets the allowable error in the thin film manufacturing process.

For example, the display panel may also include alignment marks for other purposes in addition to the plurality of cover plate alignment marks 14. Among all the alignment marks included in the display panel, for example, the cover plate alignment mark 14 is the alignment mark with the largest size, and the maximum size of the cover plate alignment mark 14 is much larger than maximum sizes of the alignment marks for other purposes. This is conducive to improving the ability of the alignment device to identify the cover plate alignment marks.

For example, as illustrated in FIG. 1A, the second frame region is provided with a circuit board alignment mark 41 (in FIG. 1A, two circuit board alignment marks 41 are taken as an example; in other embodiments, the number of circuit board alignment marks may also be one or more), and the circuit board alignment mark 41 is used for alignment in the process of bending the flexible circuit board 40, so that the flexible circuit board 40 is bent according to the set bending degree. For example, an orthographic projection of the circuit board alignment mark 41 on the base substrate 11 is spaced apart from the orthographic projections of the plurality of cover alignment marks 14 on the base substrate 11 (for example, the circuit board alignment mark 41 is located on a side of the cover plate alignment marks 14 close to the edge 11A of the base substrate 11), and a maximum size of the orthographic projection of the circuit board alignment mark 41 on the base substrate 11 is smaller than a maximum size of the cover plate alignment mark 14 on the base substrate 11. Because the circuit board alignment mark 41 is spaced apart from the plurality of cover plate alignment marks 14 and the size of the circuit board alignment mark 41 is smaller than that of the cover plate alignment mark 14, it is possible to prevent the circuit board alignment mark 41 from affecting the alignment between the display substrate 10 and the cover plate 30. It should be noted that the maximum size of the orthographic projection refers to the maximum size in all directions of the outline of the orthographic projection, that is, the maximum distance between two points on the orthographic projection. In addition, the circuit board alignment mark 41 and the cover plate alignment mark 14 may have the same shape (i.e., the same outline shape), or may have different shapes.

For example, each of the cover plate alignment marks 14 has an integrated structure. For example, each circuit board alignment mark 41 is also has an integrated structure. A case where both the cover plate alignment mark 14 and the circuit board alignment mark 41 have an integrated structure is taken as an example, as illustrated in FIG. 1A, the orthographic projection of each of the plurality of cover plate alignment marks 14 on the base substrate includes a first extending portion extending along the first direction x and a second extending portion extending along the second direction y, the first extending portion and the second extending portion are directly connected, and the maximum size of the second extending portion in the second direction y is the maximum size of the orthographic projection of the cover plate alignment mark 14. Similarly, the circuit board alignment mark 41 also includes a first extending portion extending along the first direction x and a second extending portion extending along the second direction y, the first extending portion and the second extending portion are directly connected, and the maximum size of the second extending portion in the second direction y is the maximum size of the orthographic projection of the circuit board alignment mark 41. Furthermore, the maximum size of the second extending portion of the cover alignment mark 14 is larger than the maximum size of the second extending portion of the circuit board alignment mark 14. It should be noted that each extending portion of the cover plate alignment mark 14 is a continuous structure without a closed opening, so that the orthographic projection of the whole cover plate alignment mark 14 is also a continuous structure without a closed opening. Similarly, each extending portion of the circuit board alignment mark 41 is a continuous structure without a closed opening, so that the orthographic projection of the whole circuit board alignment mark 41 is also a continuous structure without a closed opening.

For example, the maximum size of the orthographic projection of the cover plate alignment mark 14 on the base substrate 11 ranges from about 150 microns to 600 microns, such as 300 microns to 500 microns. For example, each of the plurality of cover plate alignment marks 14 in FIG. 1A has a maximum size in the second direction y, and the maximum size ranges from about 150 microns to 600 microns, such as 300 microns to 500 microns, such as about 150 microns, 200 microns, 250 microns, 300 microns, 350 microns, 400 microns, 450 microns, 500 microns, or 550 microns. By making the cover plate alignment mark 14 have a larger size, it is beneficial for the alignment device to identify the cover plate alignment mark 14, thereby improving the alignment accuracy. It should be noted that "about" here refers to being within the allowable error range of the manufacturing process. For example, the maximum design size of the cover plate alignment mark 14 is d, which ranges from 150 microns to 600 microns (e.g., 300 microns to 500 microns). However, due to the influence of the manufacturing process, the actual maximum size of the manufactured cover plate alignment mark 14 may slightly deviate from the maximum design size, and the difference between the actual maximum size and the maximum design size of the cover plate alignment mark 14 in this embodiment of the present disclosure meets the requirements of the allowable error range. In addition, the allowable error range can be set according to actual needs, so it will not be repeated here.

For example, the maximum size of the orthographic projection of the cover plate alignment mark 14 on the base substrate 11 in the first direction X is also several hundred microns, such as ranges from about 150 microns to 600 microns, such as about 300 microns to 500 microns, and the size of the orthographic projection of the cover plate alignment mark 14 in the first direction X is smaller than its size in the second direction Y, so as to further improve the identifiability of the cover plate alignment mark 14 and further improve the alignment accuracy.

For example, the orthographic projection of the cover plate alignment mark 14 on the base substrate 11 includes at least one shape selected from a group consisting of a T shape (as illustrated in FIG. 1A), a cross shape, and an L shape, or the orthographic projection of the cover plate alignment mark 14 is in any other easily recognizable shape. For example, the shape of the orthographic projection of the cover plate alignment mark 14 on the base substrate 11 is an integrated structure, for example, the T shape, the cross shape and the L shape are all integrated structures. In other embodiments, the shape of the orthographic projection of the cover plate alignment mark 14 on the base substrate 11 may also include a plurality of discrete portions, for example, the orthographic projection of the alignment mark 14 includes a plurality of spaced concentric circles. Embodiments of the present disclosure include, but are not limited to, these enumerate shapes.

For example, in the process of aligning the display substrate 10 with the cover plate 30, the alignment device can be used for alignment under a light illumination condition. In this case, in order to clearly identify the cover plate alignment marks 14, for example, the cover plate alignment marks 14 are opaque. For example, the material of the cover plate alignment mark 14 is an opaque metal, so that the cover plate alignment marks 14 are opaque. In other embodiments, the cover plate alignment mark 14 may also be made of non-metallic opaque materials.

For example, in the case where the cover plate alignment marks 14 are made of a metal, an original metal layer of the display substrate can be used to manufacture the cover plate alignment marks 14 to simplify the manufacturing process. For example, in some embodiments, the display panel has a touch structure to achieve the touch function, and the touch structure includes a metal layer, so the cover plate alignment marks 14 can be made of the material used to form the metal layer.

Hereinafter, the touch structure included in the display substrate will be described with reference to FIG. 1B, FIG. 5A and FIG. 5B.

For example, as illustrated in FIG. 1B, the display substrate 10 includes a touch structure 15, which is located between the encapsulation layer EPL and the optical adhesive layer 20 in the direction perpendicular to the base substrate 11. In this case, for example, the display panel can be manufactured by sequentially manufacturing the buffer layer BF, the switching element 19, the first planarization insulating layer PLN1, the second planarization insulating layer PLN2, the light emitting element 12, and the encapsulation layer EPL on the base substrate 11, then manufacturing the touch structure 15 on the base substrate 11 formed with the encapsulation layer EPL, and then adhering the display substrate 10 formed with the touch structure 15 and the cover plate 30 together through the optical adhesive layer 20. Compared with the method of manufacturing touch structure on the cover plate and then adhering the cover plate formed with the touch structure to the display substrate, the embodiments of the present disclosure can greatly reduce the costs by forming the touch structure 15 in the display substrate 10, and can make the display panel more integrated and thinner, and easier to be folded.

For example, the touch structure 15 includes at least one metal layer, and the at least one metal layer includes the cover plate alignment marks 14. The manufacturing process can be simplified by locating the cover plate alignment marks 14 in the metal layer included in the touch structure 15. In addition, because the touch structure 15 is located between the encapsulation layer EPL and the optical adhesive layer 20, the metal layer included in the touch structure 15 includes the cover plate alignment marks 14, so that it is not needed to increase the size of the frame region, which is beneficial to achieve the narrow frame design. Similarly, in order to further simplify the manufacturing process, other alignment marks included in the display substrate 10 (for example, the circuit board alignment mark 41) can also be manufactured by using the original metal layer of the display substrate. For example, because other alignment marks (such as the circuit board alignment mark 41) included in the display substrate 10 are small in size, the alignment marks can be made of the forming material of the metal layer included in the switching element 19 or the light emitting element 12 without increasing the space of the frame region. It should be noted that the orthographic projections of the plurality of cover plate alignment marks 14 on the base substrate 11 are spaced apart from the orthographic projections of other alignment marks on the base substrate 11, so as to prevent other alignment marks from affecting the alignment between the display substrate 10 and the cover plate 30.

For example, as illustrated in FIG. 1B, the touch structure 15 includes two conductive layers 15A and 15B separated by the intermediate insulating layer IIL2, and the conductive layer 15B is located between the conductive layer 15A and the base substrate 11 in a direction perpendicular to the base substrate 11; one of the two conductive layers 15A and 15B is an opaque metal layer and the other is a transparent conductive layer or both the conductive layers are opaque metal layers. For example, the conductive layer 15A is a metal layer and includes the cover plate alignment marks 14. Because the conductive layer 15A is closer to the cover plate 30 than the conductive layer 15B, it is beneficial to improving the alignment accuracy by locating the cover plate alignment marks 14 in the conductive layer 15A. In other embodiments, the conductive layer 15B may include the cover plate alignment marks 14.

Figure 5A:
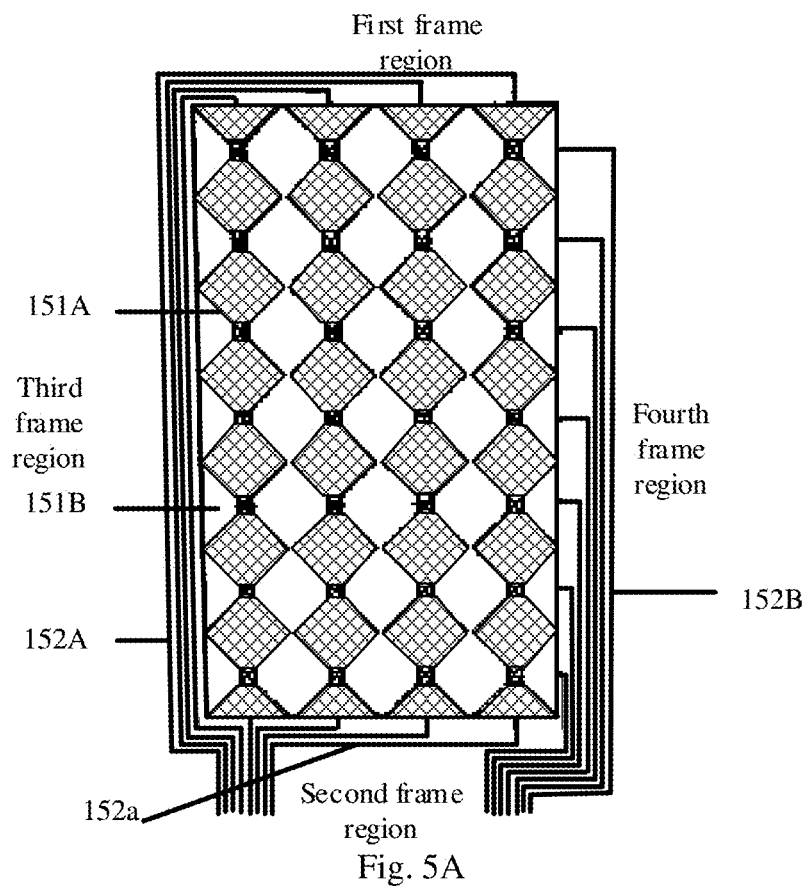
FIGS. 5A and 5B are schematic plan views of touch electrodes and touch signal lines in a display panel provided by an embodiment of the present disclosure.

For example, as illustrated in FIG. 5A, a combination of the two conductive layers 15A and 15B includes a plurality of columns of first touch electrodes 151A, a plurality of rows of second touch electrodes 151B, and a plurality of touch signal lines 152A, 152a and 152B, an extending direction of the first touch electrodes 151A and an extending direction of the second touch electrodes 151B intersect with each other, and the first touch electrodes 151A and the second touch electrodes 151B are electrically connected with their corresponding touch signal lines. For example, an end of each of the first touch electrodes 151A close to the second frame region is electrically connected with a touch signal line 152a extending directly to the second frame region, an end of each of the first touch electrodes 151A close to the first frame region is electrically connected with a touch signal line 152A extending directly to the first frame region, and the touch signal line 152A enters the second frame region after entering the third frame region from the first frame region. An end of each of the second touch electrodes 151B close to the fourth frame region is electrically connected with a touch signal line 152B extending directly to the fourth frame region. Because both ends of the first touch electrode 151A are electrically connected with touch signal lines, the impedance of the first touch electrode can be reduced.

In other embodiments, for example, the touch electrodes and the touch signal lines included in the touch structure 15 are located in the same conductive layer and made of the same material (i.e., the touch electrodes and the touch signal lines are formed by the same conductive film). In this case, for example, the same conductive layer is a metal layer.

Figure 5B:
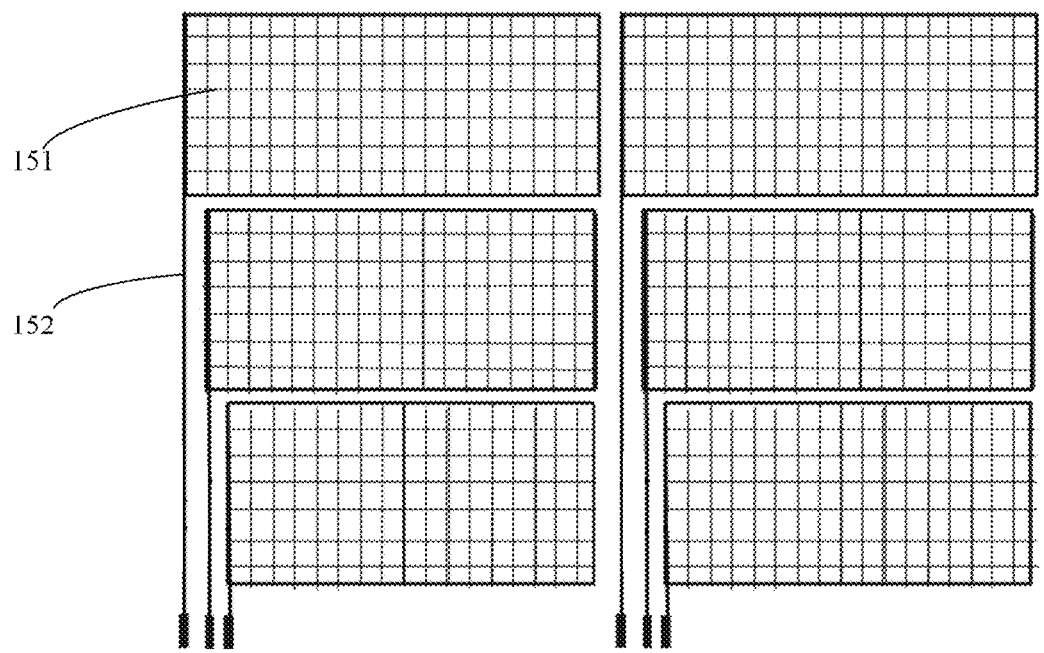

For example, as illustrated in FIG. 5B, the touch structure 15 includes a plurality of touch electrodes 151 arranged in a matrix and a plurality of touch signal lines 152, and each of the touch electrodes 151 is electrically connected with a corresponding touch signal line 152. For example, the touch electrodes 151 and the touch signal lines 152 in FIG. 5B are located in the same conductive layer.

Because the touch electrodes (referring to the first touch electrodes 151A and the second touch electrodes 151B in FIG. 5A and the touch electrodes 151 in FIG. 5B) are located in the display region, in order to avoid affecting the display, for example, the touch electrodes are mainly made of transparent conductive materials such as ITO (indium tin oxide) or IZO (indium zinc oxide), or the touch electrodes are made of metal materials to be in a grid shape (as illustrated in FIG. 5B, the touch electrodes 151 have a grid structure). Touch signal lines (referring to the touch signal lines 152A, 152a and 152B in FIG. 5A) are located in the frame region or touch signal lines (referring to touch signal lines 152 in FIG. 5B) are located in the region between adjacent light emitting elements 12 in the display region, which does not affect the display, so the touch signal lines are made of metal materials, for example, so as to reduce the resistance.

It should be noted that the embodiments shown in FIG. 5A and FIG. 5B are only used for description, and the arrangement modes of touch electrodes and touch signal lines include but are not limited to the embodiments shown in FIG. 5A and FIG. 5B.

For example, as illustrated in FIG. 1B, the touch structure 15 further includes a buffer layer BFL. The conductive layer 15B directly covers a side of the buffer layer BFL away from the encapsulation layer EPL, so that the adhesion of the conductive layer 15B can be improved to prevent the conductive layer 15B from falling off. For example, the buffer layer BFL is a silicon oxynitride layer or other similar inorganic insulating layer.

For example, as illustrated in FIG. 1B, the touch structure 15 further includes a protective layer PL located between the conductive layer 15A and the optical adhesive layer 20 to protect the conductive layer 15A.

For example, as illustrated in FIG. 1C, FIG. 1D and FIG. 2B, the display substrate 10 further includes an electrode layer extending portion 17 electrically connected with the light emitting element 12, and the electrode layer extending portion 17 is located in the frame region. For example, the electrode layer extending portion 17 is electrically connected with the second electrode layer 122 (e.g., the cathode) of the light emitting element 12, and is also electrically connected with the lead line 70 (as illustrated in FIG. 1H), so the second electrode layer 122 of the light emitting element 12 is electrically connected with the lead line 70 through the electrode layer extending portion 17. In the direction perpendicular to the base substrate 11, the electrode layer extending portion 17 is located between the cover plate alignment marks 14 (referring to FIG. 1C, FIG. 1D and FIG. 2B) and the base substrate 11; furthermore, an orthographic projection of the electrode layer extending portion 17 on the base substrate 11 is overlapped with the orthographic projections of the cover plate alignment marks 14 on the base substrate 11. Because the signal lines in the first frame region are densely distributed, by arranging the cover plate alignment marks 14 in the first frame region on a side of the electrode layer extending portion 17 away from the base substrate 11, the space of the first frame region can be effectively utilized without increasing the size of the frame region (that is, it is beneficial to achieve the narrow frame design).

For example, as illustrated in FIG. 1C and FIG. 2B, the electrode layer extending portion 17 includes a first conductive layer 171 and a second conductive layer 172 which are stacked, the second conductive layer 172 is located on a side of the first conductive layer 171 away from the base substrate 11, and the second conductive layer 172 has a portion recessed toward the base substrate 11 with respect to at least part of the structures such as the pixel defining layer PDL, the first planarization insulating layer PLN1, the second planarization insulating layer PLN2 and the like. For example, as illustrated in FIG. 1C, a first sub-conductive layer 172A, a second sub-conductive layer 172B, and a third sub-conductive layer 172C included in the second conductive layer 172 all include portions recessed toward the base substrate 11 with respect to the second planarization insulating layer PLN2 and the pixel defining layer PDL. For example, as illustrated in FIG. 2B, a first sub-conductive layer 172A, a second sub-conductive layer 172B, and a third sub-conductive layer 172C included in the second conductive layer 172 all include portions recessed toward the base substrate 11 with respect to the first planarization insulating layer PLN1, the second planarization insulating layer PLN2, and the pixel defining layer PDL. For example, the second conductive layer 172 is electrically connected to the first conductive layer 171 at the recessed region 170, and the cover plate alignment marks 14 are located in the recessed region 170 defined by the second conductive layer 172 (a region between the dashed line B and the dashed line C in FIG. 1H). For example, an orthographic projection of the recessed region 170 on the base substrate is a closed annular structure between the display region and an orthographic projection of the edge F of the second electrode layer 122.

For example, as illustrated in FIG. 2B, the first conductive layer 171 extends to a side of the second dam glue 52 away from the first dam glue 51, the first sub-conductive layer 172A and the second sub-conductive layer 172B both extend to a region where the second dam glue 52 is arranged in the display substrate 10, and the third sub-conductive layer 172C extends to a side of the first dam glue 51 away from the second dam glue 52. In this case, for example, the lead line 70 (as illustrated in FIG. 1H) led out from the flexible circuit board 40 is in direct contact with the first conductive layer 171, so that the lead line 70 is electrically connected to the second electrode layer 122 of the light emitting element 12 through the electrode layer extending portion 17. In other embodiments, the lead line 70 may also directly contact the first sub-conductive layer 172A and/or the second sub-conductive layer 172B, so that the lead line 70 is electrically connected to the second electrode layer 122 of the light emitting element 12 through the electrode layer extending portion 17.

In an embodiment of the present disclosure, the first planarization insulating layer PLN1, the second planarization insulating layer PLN2, and the pixel defining layer PDL extend to the frame region and are disconnected at the recessed region 170, so that the first conductive layer 171 and the second conductive layer 172 are overlapped and electrically connected (e.g., directly contacted) in the recessed region 170. The electrode layer extending portion 17 includes the first conductive layer 171 and the second conductive layer 172 which are connected in parallel, the resistance of the electrode layer extending portion 17 can be reduced. By arranging the cover plate alignment marks 14 in the recessed region 170, it is able to avoid increasing the thickness of the display substrate in the recessed region 170, which is conducive to achieving the thinning of the display panel. It should be noted that FIG. 2B only shows a partial cross-sectional view of the recessed region 170.

For example, as illustrated in FIG. 1C and FIG. 2B, the second conductive layer 172 includes a plurality of sub-conductive layers connected in parallel (for example, portions of the sub-conductive layers located in the entire recessed region 170 are connected in parallel with each other). For example, the plurality of sub-conductive layers which are connected in parallel include a first sub-conductive layer 172A, a second sub-conductive layer 172B, and a third sub-conductive layer 172C which are sequentially stacked on the base substrate 11. For example, the first sub-conductive layer 172A directly contacts the second sub-conductive layer 172B in the recessed region 170 and the second sub-conductive layer 172B directly contacts the third sub-conductive layer 172C in the recessed region 170 to achieve the parallel connection among the three sub-conductive layers. Furthermore, the first sub-conductive layer 172A is located between the second sub-conductive layer 172B and the base substrate 11 in a direction perpendicular to the base substrate 11. The resistance of the electrode layer extending portion 17 can be further reduced by making the second conductive layer 172 include a plurality of sub-conductive layers connected in parallel.

For example, as illustrated in FIG. 1B, the first source/drain electrode layer 1710 where the first conductive layer 171 (not shown in FIG. 1B) is located includes the source electrode 193 and the drain electrode 194 of the switching element 19, that is, the first source/drain electrode layer 1710 includes the first conductive layer 171, the source electrode 193 and the drain electrode 194. For example, as illustrated in FIG. 1B, the second source/drain electrode layer 1721 where the first sub-conductive layer 172A (not shown in FIG. 1B) is located includes the connection portion 194A (i.e., the second source/drain electrode layer 1721 includes the first sub-conductive layer 172A and the connection portion 194A), the connection portion 194A is located between the first source/drain electrode layer 1710 and the first electrode in the direction perpendicular to the base substrate 11, and the connection portion 194A electrically connects the drain electrode 194 with the first electrode layer 121, which is beneficial to a good electrical connection between the drain electrode 194 and the first electrode layer 121 (e.g., the anode) of the light emitting element 12. For example, as illustrated in FIG. 1B, the electrode layer 1722 where the second sub-conductive layer 172B (not shown in FIG. 1B) is located includes the first electrode layer 121 (e.g., the anode) of the light emitting element 12, that is, the electrode layer 1722 includes the second sub-conductive layer 172B and the first electrode layer 121. For example, as illustrated in FIG. 1B, the electrode layer 1723 where the third sub-conductive layer 172C (not shown in FIG. 1B) is located includes the second electrode layer 122 (e.g., the cathode) of the light emitting element 12, that is, the electrode layer 1723 includes the third sub-conductive layer 172C and the second electrode layer 122, for example, the third sub-conductive layer 172C is directly connected with the second electrode layer 122. That is, the first conductive layer 171 is disposed in the same layer and made of the same material as the source electrode 193 and the drain electrode 194, and the first conductive layer 171 is electrically insulated from the source electrode 193/the drain electrode 194. The second sub-conductive layer 172B is disposed in the same layer and made of the same material as the first electrode layer 121 of the light emitting element 12, and is electrically insulated from the first electrode layer 121. The third sub-conductive layer 172C is disposed in the same layer and made of the same material as the second electrode layer 122 of the light emitting element 12, and is electrically connected with the second electrode layer 122 of the light emitting element 12 (for example, the third sub-conductive layer 172C is directly connected with the second electrode layer 122). In the embodiments of the present disclosure, the manufacturing process of the display panel can be simplified by using a portion of the electrode layers in the display region extending to the frame region to form the electrode layer extending portion 17, which can simplify the manufacturing process of the display panel.

It should be noted that multiple components being disposed in the same layer and made of the same material refers to that the multiple components are formed by the same thin film in the same patterning process; in addition, the multiple components may be located on the same layer side by side, or there is a height difference between the multiple components (that is, the distances from the multiple components to the base substrate 11 are different), or at least one of the multiple components has a convex portion or a recessed portion.

In at least one embodiment of the present disclosure, for example, the width of the second frame region is larger than the width of the first frame region, that is, the size of the second frame region along the first direction X is larger than the size of the first frame region along the first direction X, which makes the distribution of electrode layer extending portion 17 in the second frame region sparser than that in the first frame region, so the cover plate alignment marks 14 in the second frame region can be located in a flat region outside the region where the electrode layer extending portion(s) 17 is located. For example, as illustrated in FIG. 1E and FIG. 1F, the cover plate alignment marks in the second frame region are not overlapped with the electrode layer extending portion 17.

For example, in the display panel shown in FIG. 1B to FIG. 1F and FIG. 2B, the following structures are sequentially provided on the base substrate 11: the buffer layer BF, the active layer 191, the first gate electrode insulating layer GIL1, the gate electrode 192, the second gate electrode insulating layer GIL2, the first intermediate insulating layer IIL1, the first source/drain electrode layer 1710 including the source electrode 193 and the drain electrode 194 (for example, the first source/drain electrode layer 1710 further includes the first conductive layer 171), the passivation insulating layer PVX, the first planarization insulating layer PLN1, the second source/drain electrode layer 1721 including the connection portion 194A (for example, the second source/drain electrode layer 1721 further includes the first sub-conductive layer 172A), the second planarization insulating layer PLN2, the first electrode layer 121 (for example, the electrode layer 1722 where the first electrode layer 121 is located further includes the second sub-conductive layer 172B), the pixel defining layer PDL, the light emitting layer 123, the second electrode layer 122 (for example, the electrode layer 1723 where the second electrode layer 122 is located further includes the third sub-conductive layer 172C), the encapsulation layer EPL (which includes, for example, the first inorganic encapsulation layer EPL1, the first organic encapsulation layer EPL3, and the second inorganic encapsulation layer EPL2, in which the first organic encapsulation layer EPL3 is not overlapped with the cover plate alignment marks 14), and the touch structure 15 (which includes, for example, the buffer layer BFL, the conductive layer 15B, the second intermediate insulating layer IIL2, the conductive layer 15A, and the protective layer PL, the layer where the conductive layer 15B is located and/or the layer where the conductive layer 15 is located, for example, includes the plurality of the cover plate alignment marks 14 which are spaced apart). In other embodiments, the display panel may not include some of the above structures, or may include other structures based on the above structures, or the positional relationship of the above structures in the display panel may change.

At least one embodiment of the present disclosure further provides a display panel, as illustrated in FIG. 1A to FIG. 3B, which includes a display substrate 10, an optical adhesive layer 20, and a cover plate 30. The cover plate is located on a side of the optical adhesive layer 20 away from the display substrate 10, and is connected to the display substrate 10 through the optical adhesive layer 20.

As illustrated in FIG. 1B, the display substrate 10 includes a flexible base substrate 11 and a plurality of light emitting elements 12 on the base substrate 11 (only one light emitting element 12 is shown in FIG. 1B for illustration), a pixel defining layer PDL, and an encapsulation layer EPL. The pixel defining layer PDL separates the plurality of light emitting elements 12, and the encapsulation layer EPL is located on a side of the plurality of light emitting elements 12 away from the base substrate 11. An optical adhesive layer 20 is provided on a side of the encapsulation layer EPL away from the base substrate 11. The encapsulation layer EPL includes a first inorganic encapsulation layer EPL1, a first organic encapsulation layer EPL3, and a second inorganic encapsulation layer EPL2 which are sequentially arranged in the direction away from the base substrate 11. The display substrate 10 further includes a plurality of cover plate alignment marks 14 configured for aligning the display substrate 10 with the cover plate 30. The display substrate 10 further includes a touch structure 15, which is located between the encapsulation layer EPL and the optical adhesive layer 20 in a direction perpendicular to the base substrate 11. The touch structure 15 includes at least one metal layer (illustrated by taking two metal layers 15A and 15B as an example in FIG. 1B), and the at least one metal layer includes the cover plate alignment marks, such as the cover plate alignment marks 14 in any one of the embodiments shown in FIG. 1A, FIG. 1C to FIG. 2B. That is, the at least one metal layer included in the touch structure 15 includes a touch electrode and a touch signal line, and at least one of the touch electrode and the touch signal line is disposed in the same layer and made of the same material as the cover plate alignment marks 14, that is, at least one of the touch electrode and the touch signal line and the cover plate alignment marks 14 are formed by the same thin film. For the description of the touch electrode and the touch signal line, please refer to the descriptions in the above embodiments, and the repeated portions will not be described herein.

In the embodiments of the disclosure, because the plurality of cover plate alignment marks 14 included in the display substrate 10 are located in at least one metal layer included in the touch structure, each of the plurality of cover plate alignment marks 14 can have a relatively large size without increasing the size of the frame region, which is convenient for the alignment between the display substrate 10 and the cover plate 30 included in the display panel, thereby improving the alignment accuracy, avoiding the phenomenon that edges of the display region are blurred in a display panel, especially in a curved display panel (for example, a display panel with a curved edge region), and improving the production efficiency.

For example, as illustrated in FIG. 1A, the display panel includes a display region and a frame region located at the periphery of the display region, and the frame region includes an annular dam glue 50 and an annular cutting region located outside the dam glue 50. An orthographic projection of at least one of the plurality of cover plate alignment marks 14 included in the display substrate 10 on the base substrate 11 is located between an orthographic projection of the dam glue 50 on the base substrate 11 and the display region and is overlapped with the second inorganic encapsulation layer EPL2 in a direction perpendicular to the base substrate 11, and/or an orthographic projection of at least one of the plurality of cover plate alignment marks 14 on the base substrate is located between the orthographic projection of the dam glue 50 on the base substrate and the cutting region.

Embodiments of the present disclosure further provide a manufacturing method of the display panel provided by any one of the above embodiments. Taking the display panel shown in FIG. 1A to FIG. 3B as an example, the manufacturing method includes the following steps.

Step S1: forming a pixel defining layer PDL on a flexible base substrate 11.

Step S2: forming a plurality of light emitting elements 12 on the base substrate 11 (only one light emitting element 12 is shown in FIG. 1B for illustration), and the pixel defining layer PDL separates the plurality of light emitting elements 12.

Step S3: forming an encapsulation layer EPL on the base substrate 11, and the encapsulation layer EPL is located on a side of the plurality of light emitting elements 12 away from the base substrate 11, and the encapsulation layer EPL includes a first inorganic encapsulation layer EPL1, a first organic encapsulation layer EPL3, and a second inorganic encapsulation layer EPL2 which are sequentially arranged in a direction away from the base substrate 11.

Step S4: forming a plurality of cover plate alignment marks 14 on the base substrate 11, the plurality of cover plate alignment marks 14 are configured for aligning the display substrate including the pixel defining layer PDL, the light emitting elements 12, the encapsulation layer EPL, and the cover plate alignment marks 14 with the cover plate 30; the display panel includes a display region and a frame region located at a periphery of the display region. The frame region includes a dam glue 50 and an annular cutting region located on a side of the dam glue 50 away from the display region. An orthographic projection of at least one of the plurality of cover plate alignment marks 14 on the base substrate 11 is located between an orthographic projection of the dam glue on the base substrate 11 and display region, and the at least one of the plurality of cover plate alignment marks 14 is overlapped with the second inorganic encapsulation layer EPL2 in a direction perpendicular to the base substrate 11, and/or an orthographic projection of at least one of the plurality of cover plate alignment marks 14 on the base substrate 11 is located between the orthographic projection of the dam glue 50 on the base substrate 11 and cutting region.

Step S5: forming an optical adhesive layer 20 on a side of the plurality of cover plate alignment marks 14 away from the base substrate 11.

Step S6: connecting the display substrate 10 formed with the plurality of cover plate alignment marks 14 to the cover plate 30 by using the optical adhesive layer 20, the base substrate 11 of the display substrate 10 is substantially flat before the display substrate 10 is connected to the cover plate 30 and includes a curved portion B after the display substrate 10 is connected to the cover plate 30 (as illustrated in FIG. 3B).

It should be noted that the embodiments of the present disclosure only schematically illustrate that the manufacturing method of the display panel includes the above steps, and do not limit the manufacturing sequence of the above steps, and the manufacturing sequence of the above steps can be adjusted according to actual needs.

Figure 6:
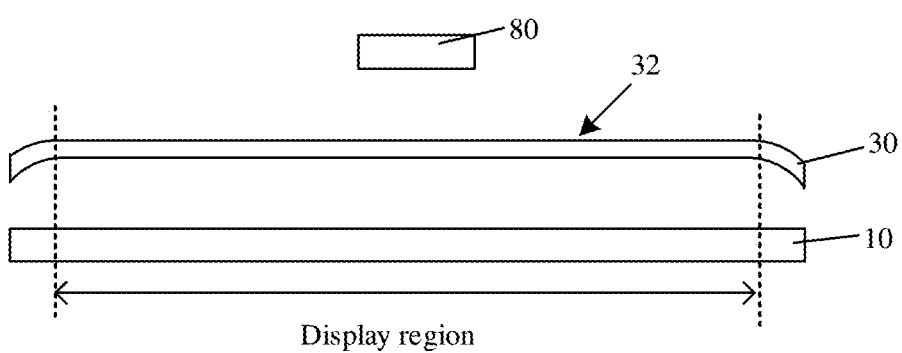
FIG. 6 is a schematic diagram of an alignment device, a display substrate, and a cover plate in an embodiment of the present disclosure.

For example, as illustrated in FIG. 4, the cover plate 30 includes a window portion 32 located in the display region and a light shielding portion 31 located outside the display region (i.e., the light shielding portion 31 is located in the frame region), and the orthographic projections of the plurality of cover plate alignment marks 14 on the base substrate 11 are located in a region where an orthographic projection of the light shielding portion 31 on the base substrate 11 is located. In this case, connecting the display substrate 10 formed with the plurality of cover plate alignment marks 14 to the cover plate 30 by using the optical adhesive layer 20 includes: irradiating the cover plate and the display substrate by light, and aligning the display substrate 10 with the cover plate 30 by using the plurality of cover plate alignment marks 14 and the light shielding portion 31, as illustrated in FIG. 6. For example, in the process of irradiating the cover plate 30 and the display substrate 10 by light, an alignment device 80 can calculate a center of the display region of the display substrate 10 according to the plurality of cover plate alignment marks 14 included in the display substrate 10, and the alignment device 80 can calculate a center of the window portion 32 of the cover plate 30 according to an inner edge 31A of the light shielding portion 31 in the cover plate 30 (that is, the edge of the display region). The alignment device 80 can align the display substrate 10 with the cover plate 30 by aligning the center of the display region of the display substrate 10 with the center of the window portion 32 of the cover plate 30. In addition, during the alignment process, the display substrate 10 and the cover plate 30 are connected together through the optical adhesive layer 20.

For example, as illustrated in FIG. 1B, in the case where the display substrate 10 includes a touch structure 15, the manufacturing method of the display substrate 10 includes: forming a switch element 19, a first planarization insulating layer PLN1, a second planarization insulating layer PLN2, a light emitting element 12 (for example, the light emitting element 12 is formed by an evaporation process), and an encapsulation layer EPL on the base substrate 11 in sequence, and then forming the touch structure 15 on a side of the encapsulation layer EPL away from the base substrate 11. Compared with the method of manufacturing the touch structure on the cover plate and then adhering the cover plate formed with the touch structure and the display substrate, the embodiments of the present disclosure can greatly reduce the costs by forming the touch structure 15 in the display substrate 10, and can make the display panel more integrated and thinner and easier to be folded.

For example, as illustrated in FIG. 1B, forming the touch structure 15 includes: forming a conductive layer 15B, an intermediate insulating layer IIL2, and a conductive layer 15A sequentially stacked on the encapsulation layer EPL, and a combination of the conductive layer 15B and the conductive layer 15A includes the cover alignment marks 14, touch electrodes (referring to 151A and 151B in FIG. 5A), and touch signal lines (referring to 152A, 152a and 152B in FIG. 5A). The manufacturing process can be simplified by locating the cover plate alignment marks 14 in the conductive layer included in the touch structure 15.

For example, the conductive layer 15A is a metal layer and includes the cover plate alignment marks 14. Because the conductive layer 15A is closer to the cover plate 30 than the conductive layer 15B, it is beneficial to improving the alignment accuracy by locating the plurality of cover plate alignment marks 14 in the conductive layer 15A.

For example, forming the touch structure 15 further includes: forming the conductive layer 15B directly on the buffer layer BFL on the encapsulation layer EPL, and forming a protective layer PL covering the conductive layer 15A after forming the conductive layer 15A.

In other embodiments, the touch structure 15 includes one conductive layer, which is a metal layer, and the one conductive layer includes the plurality of cover plate alignment marks 14, a touch electrode (referring to 151 in FIG. 5B), and a touch signal line (referring to 152 in FIG. 5B). Embodiments of that present disclosure include, but are not limited to these enumerate embodiments.

For example, the manufacturing method of the display panel shown in FIG. 1A to FIG. 3B includes: sequentially forming the following structures on the base substrate 11: a switching element 19 (for example, the first source/drain electrode layer 1710 where the source electrode 193 and the drain electrode 194 of the switching element 19 are located also includes the first conductive layer 171), a passivation insulating layer PVX, a first planarization insulating layer PLN1, a second source/drain electrode layer 174 including a connection portion 194A (for example, the second source/drain electrode layer 1721 also includes a first sub-conductive layer 172A), a second planarization insulating layer PLN2, a first electrode layer 121 (for example, the electrode layer 1722 where first electrode layer 121 is located also includes a second sub-conductive layer 172B), a pixel defining layer PDL, a light emitting layer 123, a second electrode layer 122 (for example, the electrode layer 1723 where the second electrode layer 122 is located also includes a third sub-conductive layer 172C), an encapsulation layer EPL (which includes, for example, a first inorganic encapsulation layer EPL1, a first organic encapsulation layer EPL3, and a second inorganic encapsulation layer EPL2, in which the first organic encapsulation layer EPL3 is not overlapped with the cover plate alignment marks 14), and a touch structure 15 (which includes, for example, a buffer layer BFL, a conductive layer 15B, a second intermediate insulating layer IIL2, a conductive layer 15A, and a protective layer PL, the layer where the conductive layer 15B and/or the conductive layer 15A is located also includes the plurality of cover plate alignment marks 14).

For example, before forming the passivation insulating layer PVX, the manufacturing method of the display panel further comprises: sequentially forming a buffer layer BF, an active layer 191, a first gate electrode insulating layer GIL1 covering the active layer 191, a gate electrode 192 located on a side of the first gate electrode insulating layer GIL1 away from the base substrate 11, a second gate electrode insulating layer GIL2 covering the gate electrode 192, a first intermediate insulating layer IIL1 covering the second gate electrode insulating layer GIL2, and a first source/drain electrode layer 1710 located on a side of the first intermediate insulating layer IIL1 away from the base substrate 11. The first source/drain electrode layer 1710 includes a source electrode 193 and a drain electrode 194 electrically connected to the active layer 191, for example, the source electrode 193 and the drain electrode 194 extend through through-holes in the first intermediate insulating layer IIL1, the second gate electrode insulating layer GIL2, and the first gate electrode insulating layer GIL1 to be electrically connected with the active layer 191.

Upon the structures of the display panel in the embodiments of the present disclosure changing, the above steps of the manufacturing method are adjusted accordingly.

At least one embodiment of the present disclosure further provides an alignment method, which can be used for alignment in the manufacturing process of the display panel as provided in any one of the embodiments shown in FIG. 1A to FIG. 3B.

As illustrated in FIG. 1A to FIG. 3B, the display panel which can adopt the alignment method includes a display substrate 10, an optical adhesive layer 20, and a cover plate 30. The display panel includes a display region and a frame region located at the periphery of the display region. The frame region includes an annular dam glue 50 and an annular cutting region located on a side of the dam glue 50 away from the display region. The cover plate 30 is located on a side of the optical adhesive layer 20 away from the display substrate 10, and is connected to the display substrate 10 through the optical adhesive layer 20. As illustrated in FIG. 4, the cover plate 30 includes a window portion 32 located in the display region and a light shielding portion 31 located in the frame region. The display substrate 10 includes a flexible base substrate 11 (not labeled in FIG. 1A) and a plurality of light emitting elements 12 (as illustrated in FIG. 1G), a pixel defining layer PDL, and an encapsulation layer EPL disposed on the base substrate 11. The pixel defining layer PDL is used to separate the plurality of light emitting elements 12 (as illustrated in FIG. 1G), that is, the pixel defining layer PDL is used to define a plurality of sub-pixel regions, each of the plurality of sub-pixel regions is provided with one light emitting element 12. The encapsulation layer EPL is located on a side of the plurality of light emitting elements 12 away from the base substrate 11, for preventing water, oxygen and the like in the air from corroding the plurality of light emitting elements 12. The encapsulation layer EPL includes a first inorganic encapsulation layer EPL1, a first organic encapsulation layer EPL3, and a second inorganic encapsulation layer EPL2 (as illustrated in FIG. 1B) arranged in sequence in a direction away from the base substrate 11, that is, the distances from the first inorganic encapsulation layer EPL1, the first organic encapsulation layer EPL3, and the second inorganic encapsulation layer EPL2 to the base substrate 11 gradually increase. The display substrate 10 further includes a plurality of cover plate alignment marks 14 configured for aligning the display substrate 10 with the cover plate 30. The plurality of cover plate alignment marks 14 are located in the frame region. An orthographic projection of at least one of the plurality of cover plate alignment marks 14 on the base substrate is located between an orthographic projection of the dam glue 50 on the base substrate and display region (as illustrated in FIG. 1A) and the at least one of the plurality of cover plate alignment marks 14 is overlapped with the second inorganic encapsulation layer EPL2 in the direction perpendicular to the base substrate 11 (as illustrated in FIG. 1C, FIG. 1D, FIG. 2F and FIG. 2B), and an orthographic projection of at least another one of the plurality of cover plate alignment marks 14 on the base substrate is located between the orthographic projection of the dam glue 50 on the base substrate and cutting region (as illustrated in FIG. 1A). Or, an orthographic projection of at least one of the plurality of cover plate alignment marks 14 on the base substrate is located between the orthographic projection of the dam glue 50 on the base substrate and the display region and the at least one of the plurality of cover plate alignment marks 14 is overlapped with the second inorganic encapsulation layer EPL2 in the direction perpendicular to the base substrate 11. Or, an orthographic projection of at least one of the plurality of cover plate alignment marks 14 on the base substrate is located between the orthographic projection of the dam glue 50 on the base substrate and the cutting region.

In order to form the display panel as illustrated in FIG. 1A to FIG. 3B, the alignment method includes: irradiating the display substrate 10 and the cover plate 30 for forming the display panel by light, and calculating a center of the display region of the display substrate 10 according to the plurality of cover plate alignment marks 14 included in the display substrate 10; calculating a center of the window portion 32 of the cover plate 30 according to the edge 31A of the window portion 32 (as illustrated in FIG. 4); and aligning the center of the display region of the display substrate 10 with the center of the window portion 32 of the cover plate 30 to align the display substrate 10 with the cover plate 30.

In the embodiments of the present disclosure, because the orthographic projection of at least one of the plurality of cover plate alignment marks 14 included in the display substrate 10 is located between the orthographic projection of the dam glue 50 and the display region and/or the orthographic projection of at least one of the plurality of cover plate alignment marks 14 is located between the orthographic projection of the dam glue 50 and the cutting region, each of the plurality of cover plate alignment marks 14 can have a relatively large size without increasing the size of the frame region. In this way, the alignment between the display substrate 10 and the cover plate 30 included in the display panel is facilitated, so that the alignment accuracy can be improved, the phenomenon that an edge of the display region is blurred in a display panel, especially in a curved display panel (for example, a display panel with curved edge regions) can be avoided, and the production efficiency can be improved.

The same components in the above embodiments of the display panel, the alignment method and the manufacturing method of the display panel are arranged in the same way, and the repeated portions are not described herein.

In case of no conflict, embodiments of the present disclosure and features in embodiments can be combined.

The foregoing is only exemplary embodiments of the present disclosure, and is not intended to limit the protection scope of the present disclosure, the protection scope of the present disclosure is determined by the appended claims.

The invention claimed is:

1. A display panel, comprising:
  a display substrate, comprising a flexible base substrate and comprising a plurality of light emitting elements, a pixel defining layer, and an encapsulation layer, wherein the plurality of light emitting elements, the pixel defining layer, and the encapsulation layer are on the base substrate, the pixel defining layer separates the plurality of light emitting elements, and the encapsulation layer is on a side of the plurality of light emitting elements away from the base substrate;
  an optical adhesive layer, on a side of the encapsulation layer away from the base substrate; and
  a cover plate, on a side of the optical adhesive layer away from the display substrate and connected with the display substrate through the optical adhesive layer,
  wherein the display panel comprises a display region and a frame region at a periphery of the display region;
  the frame region comprises a dam glue region where an annular dam glue is located and an annular cutting region which is on a side of the dam glue away from the display region;
  the encapsulation layer comprises a first inorganic encapsulation layer, a first organic encapsulation layer, and a second inorganic encapsulation layer which are sequentially arranged in a direction away from the base substrate;
  the display substrate further comprises a plurality of cover plate alignment marks configured for aligning the display substrate with the cover plate; and
  at least one of the plurality of cover plate alignment marks is overlapped with the second inorganic encapsulation layer in a direction perpendicular to the base substrate, and an orthographic projection of the at least one of the plurality of cover plate alignment marks on the base substrate is between an orthographic projection of dam glue on the base substrate and the display region, and/or an orthographic projection of at least one of the plurality of cover plate alignment marks on the base substrate is between the orthographic projection of the dam glue on the base substrate and the cutting region.

2. The display panel according to claim 1, wherein the at least one of the plurality of cover plate alignment marks, of which the orthographic projection on the base substrate is between the orthographic projection of the dam glue on the base substrate and the cutting region, is not overlapped with the second inorganic encapsulation layer in the direction perpendicular to the base substrate; or the at least one of the plurality of cover plate alignment marks, of which the orthographic projection on the base substrate is between the orthographic projection of the dam glue on the base substrate and the cutting region, is at least partially overlapped with the second inorganic encapsulation layer in the direction perpendicular to the base substrate.

3. The display panel according to claim 1, wherein the display substrate comprises a touch structure, the touch structure is between the encapsulation layer and the optical adhesive layer in the direction perpendicular to the base substrate, and the touch structure comprises at least one metal layer, and the at least one metal layer comprises the plurality of cover plate alignment marks.

4. The display panel according to claim 1, wherein a maximum size of an orthographic projection of each of the plurality of cover plate alignment marks on the base substrate ranges from 150 microns to 600 microns.

5. The display panel according to claim 1, wherein an orthographic projection of each of the plurality of cover plate alignment marks on the base substrate comprises at least one shape selected from a group consisting of a T shape, a cross shape, and an L shape.

6. The display panel according to claim 1, wherein a surface of the display substrate directly bearing the plurality of cover plate alignment marks is a flat surface.

7. The display panel according to claim 1, wherein the frame region comprises a first frame region and a second frame region which are opposite to each other in a first direction;

the display panel further comprises a flexible circuit board, and the flexible circuit board is connected with the second frame region; and the first frame region is provided with the at least one of the plurality of cover plate alignment marks located between the dam glue and the display region and overlapping with the second inorganic encapsulation layer in the direction perpendicular to the base substrate, and/or the second frame region is provided with the at least one of the plurality of cover plate alignment marks located between the dam glue and the cutting region.

8. The display panel according to claim 7, wherein the frame region further comprises a third frame region and a fourth frame region which are opposite to each other in a second direction different from the first direction, and the display panel comprises a curved portion in at least one of the third frame region and the fourth frame region, and a portion of the cover plate corresponding to the curved portion is curved;

the display panel further comprises a gate electrode driver in at least one of the third frame region and the fourth frame region; and the plurality of cover plate alignment marks are located outside the third frame region and the fourth frame region.

9. The display panel according to claim 7, wherein the plurality of cover plate alignment marks comprise four cover plate alignment marks, the four cover plate alignment marks are respectively numbered as a first cover plate alignment mark, a second cover plate alignment mark, a third cover plate alignment mark, and a fourth cover plate alignment mark in an anticlockwise direction;

with respect to an axis parallel to the first direction, a combination of the first cover plate alignment mark and the second cover plate alignment mark is symmetrical with a combination of the third cover plate alignment mark and the fourth cover plate alignment mark.

10. The display panel according to claim 7, wherein the display substrate further comprises an electrode layer extending portion electrically connected with the plurality of light emitting elements, and the electrode layer extending portion is in the frame region;

in the direction perpendicular to the base substrate, the electrode layer extending portion is between the plurality of cover plate alignment marks and the base substrate; and an orthographic projection of the electrode layer extending portion on the base substrate is overlapped with orthographic projections of the plurality of cover plate alignment marks on the base substrate.

11. The display panel according to claim 10, wherein the electrode layer extending portion comprises a first conductive layer and a second conductive layer which are stacked, the second conductive layer is on a side of the first conductive layer away from the base substrate, and the second conductive layer comprises a portion recessed toward the base substrate, the portion is electrically connected with the first conductive layer, and the plurality of cover plate alignment marks are in a recessed region defined by the portion.

12. The display panel according to claim 11, wherein the second conductive layer comprises a first sub-conductive layer, a second sub-conductive layer, and a third sub-conductive layer which are sequentially arranged on the base substrate and connected in parallel; and the first sub-conductive layer is between the second sub-conductive layer and the base substrate in the direction perpendicular to the base substrate.

13. The display panel according to claim 12, wherein the display panel further comprises at least one switching element, each of the at least one switching element comprises a gate electrode, a source electrode, and a drain electrode; each of the plurality of light emitting elements comprises a first electrode layer and a second electrode layer, the first sub-conductive layer is in a same layer and made of a same material as the source electrode and drain electrode, the second sub-conductive layer is in a same layer and made of a same material as the first electrode layer, and the third sub-conductive layer is in a same layer and made of a same material as the second electrode layer.

14. The display panel according to claim 7, wherein the second frame region is provided with a circuit board alignment mark configured for bending the flexible circuit board, and an orthographic projection of the circuit board alignment mark on the base substrate is spaced apart from the orthographic projections of the plurality of cover plate alignment marks on the base substrate; and the orthographic projection of the circuit board alignment mark on the base substrate has a maximum size, an orthographic projection of each of the plurality of cover plate alignment marks on the base substrate has a maximum size, and the maximum size of the circuit board alignment mark is smaller than the maximum size of each of the plurality of cover plate alignment marks.

15. The display panel according to claim 1, wherein the cover plate comprises a window region in the display region and a light shielding portion located outside the display region;
the orthographic projections of the plurality of cover plate alignment marks on the base substrate are in a region where an orthographic projection of the light shielding portion on the base substrate is located.

16. The display panel according to claim 1, wherein each of the plurality of cover plate alignment marks has an integrated structure; and
the plurality of cover plate alignment marks are opaque.

17. The display panel according to claim 1, wherein a material of the plurality of cover plate alignment marks comprises a metal.

18. An alignment method, comprising:
irradiating a display substrate and a cover plate for forming a display panel by light, wherein the display panel has a display region and a frame region at a periphery of the display region; the display panel comprises the display substrate, the cover plate and an optical adhesive layer connecting the display substrate to the cover plate, the display substrate comprises a plurality of cover plate alignment marks, and the cover plate comprises a window portion in the display region and a light shielding portion in the frame region;
calculating a center of the display region of the display substrate according to the plurality of cover plate alignment marks;
calculating a center of a window portion of the cover plate according to an edge of the window portion of the cover plate; and
aligning the center of the display region of the display substrate with the center of the window portion of the cover plate to align the display substrate with the cover plate,
wherein the display substrate comprises a flexible base substrate and comprises a plurality of light emitting elements, a pixel defining layer, and an encapsulation layer, the plurality of light emitting elements, the pixel defining layer, and the encapsulation layer are on the base substrate, the pixel defining layer separates the plurality of light emitting elements, and the encapsulation layer is on a side of the plurality of light emitting elements away from the base substrate;
the optical adhesive layer is on a side of the encapsulation layer away from the base substrate;
the cover plate is on a side of the optical adhesive layer away from the display substrate;
the encapsulation layer comprises a first inorganic encapsulation layer, a first organic encapsulation layer, and a second inorganic encapsulation layer which are sequentially arranged in a direction away from the base substrate;
the frame region comprises a dam glue region where an annular dam glue is located and an annular cutting region which is on a side of the dam glue away from the display region;
at least one of the plurality of cover plate alignment marks is overlapped with the second inorganic encapsulation layer in a direction perpendicular to the base substrate, and an orthographic projection of the at least one of the plurality of cover plate alignment marks on the base substrate is between an orthographic projection of the dam glue on the base substrate and the display region, and/or an orthographic projection of at least one of the plurality of cover plate alignment marks on the base substrate is between the orthographic projection of the dam glue and the cutting region.

19. A display panel, comprising:

a display substrate, comprising a flexible base substrate and comprising a plurality of light emitting elements, a pixel defining layer, and an encapsulation layer, wherein the plurality of light emitting elements, the pixel defining layer, and the encapsulation layer are on the base substrate, the pixel defining layer separates the plurality of light emitting elements, and the encapsulation layer is on a side of the plurality of light emitting elements away from the base substrate;

an optical adhesive layer, on a side of the encapsulation layer away from the base substrate; and a cover plate, on a side of the optical adhesive layer away from the display substrate and connected with the display substrate through the optical adhesive layer, wherein the encapsulation layer comprises a first inorganic encapsulation layer, a first organic encapsulation layer, and a second inorganic encapsulation layer which are sequentially arranged in a direction away from the base substrate; and the display substrate further comprises a plurality of cover plate alignment marks configured for aligning the display substrate with the cover plate, and further comprises a touch structure, the touch structure is between the encapsulation layer and the optical adhesive layer in a direction perpendicular to the base substrate, and the touch structure comprises at least one metal layer, the at least one metal layer comprises the plurality of cover plate alignment marks.

20. The display panel according to claim 19, wherein the display panel comprises a display region and a frame region at a periphery of the display region, the frame region comprises a dam glue region where an annular dam glue is located and an annular cutting region on a side of the dam glue away from the display region;
at least one of the plurality of cover plate alignment marks is overlapped with the second inorganic encapsulation layer in the direction perpendicular to the base substrate, and an orthographic projection of the at least one of the plurality of cover plate alignment marks on the base substrate is between an orthographic projection of the dam glue on the base substrate and the display region, and/or an orthographic projection of at least one of the plurality of cover plate alignment marks on the base substrate is between the orthographic projection of the dam glue on the base substrate and the cutting region.

* * * * *